(12) United States Patent
Giannakopulos et al.

(10) Patent No.: US 8,642,973 B2
(45) Date of Patent: *Feb. 4, 2014

(54) DETECTION APPARATUS FOR DETECTING CHARGED PARTICLES, METHODS FOR DETECTING CHARGED PARTICLES AND MASS SPECTROMETER

(75) Inventors: Anastassios Giannakopulos, Bremen (DE); Alexander A. Makarov, Bremen (DE)

(73) Assignee: Thermo Fisher Scientific (Bremen) GmbH, Bremen, DE (US)

( * ) Notice: Subject to any disclaimer, the term of this patent is extended or adjusted under 35 U.S.C. 154(b) by 638 days.

This patent is subject to a terminal disclaimer.

(21) Appl. No.: 12/909,720

(22) Filed: Oct. 21, 2010

(65) Prior Publication Data

US 2011/0095178 A1 Apr. 28, 2011

(30) Foreign Application Priority Data

Oct. 23, 2009 (GB) .................................. 0918630.5

(51) Int. Cl.
*H01J 37/244* (2006.01)
*H01J 49/02* (2006.01)

(52) U.S. Cl.
CPC ............ *H01J 37/244* (2013.01); *H01J 49/025* (2013.01)
USPC ............................. 250/397; 250/283; 250/287

(58) Field of Classification Search
USPC .......................................... 250/397, 287, 283
See application file for complete search history.

(56) References Cited

U.S. PATENT DOCUMENTS

| | | | |
|---|---|---|---|
| 3,898,456 A | 8/1975 | Dietz | |
| 4,691,160 A | 9/1987 | Ino | |
| 5,969,361 A * | 10/1999 | Blavette et al. | ............... 250/397 |
| 5,990,483 A | 11/1999 | Shariv et al. | |
| 6,229,142 B1 | 5/2001 | Bateman et al. | |
| 6,355,921 B1 | 3/2002 | Staton et al. | |
| 6,518,556 B2 | 2/2003 | Staton et al. | |
| 6,614,019 B2 | 9/2003 | Feller et al. | |
| 6,646,252 B1 | 11/2003 | Gonin | |
| 6,674,068 B1 | 1/2004 | Kammei | |
| 6,756,587 B1 | 6/2004 | Bateman et al. | |
| 6,828,729 B1 | 12/2004 | Owens et al. | |
| 6,906,318 B2 * | 6/2005 | Bateman et al. | ............... 250/287 |
| 6,958,474 B2 | 10/2005 | Laprade et al. | |
| 7,026,177 B2 | 4/2006 | Laprade | |

(Continued)

FOREIGN PATENT DOCUMENTS

| | | |
|---|---|---|
| EP | 0 278 034 A1 | 8/1988 |
| EP | 1 215 711 B1 | 1/2007 |
| WO | WO 2009/027252 A2 | 3/2009 |

OTHER PUBLICATIONS

Dubois et al., "Optimization of an Ion-to-Photon Detector for Large Molecules in Mass Spectrometry," Rapid Commun. Mass Spectrom. 13, pp. 1958-1967 (1999).

*Primary Examiner* — Jack Berman
(74) *Attorney, Agent, or Firm* — Charles B. Katz

(57) ABSTRACT

Embodiments of the invention provide a detection apparatus for detecting charged particles having a charged particle detector for receiving and detecting either incoming charged particles or secondary charged particles generated from the incoming charged particles, a photon generator for generating photons in response to receiving at least some of the same incoming charged particles or secondary charged particles generated from the incoming charged particles as are received and detected by the charged particle detector, and a photon detector for detecting photons generated by the photon generator.

16 Claims, 22 Drawing Sheets

(56) References Cited

U.S. PATENT DOCUMENTS

| | | |
|---|---|---|
| 7,220,970 B2 | 5/2007 | Rottmann et al. |
| 7,265,346 B2 | 9/2007 | Whitehouse et al. |
| 2002/0175292 A1 | 11/2002 | Whitehouse et al. |
| 2004/0149900 A1 | 8/2004 | Makarov et al. |
| 2004/0227070 A1 | 11/2004 | Bateman et al. |
| 2005/0056779 A1 | 3/2005 | Chefetz et al. |

\* cited by examiner

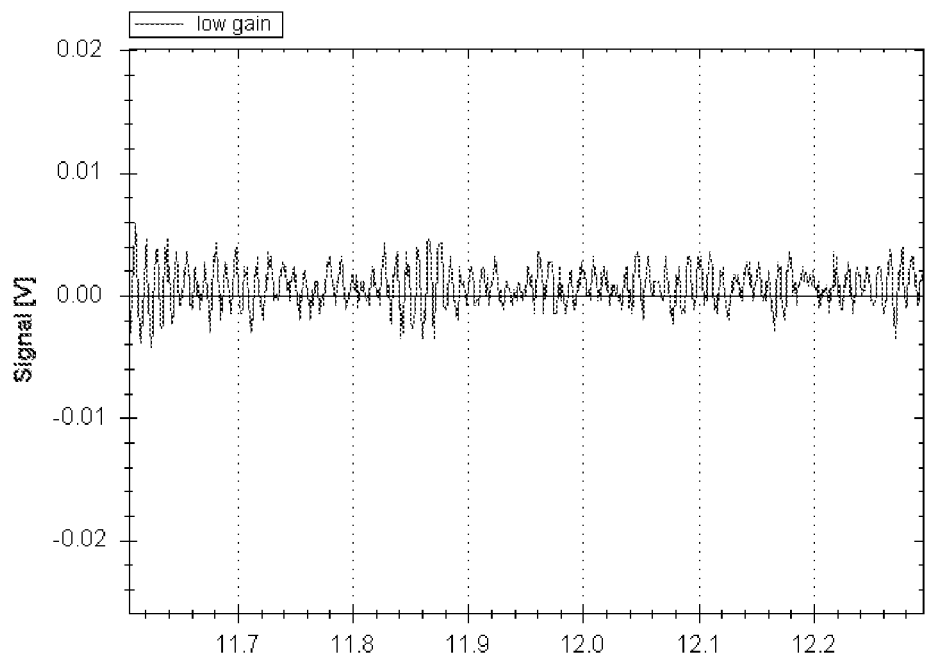
Fig. 5A (1 ion, charge detection)
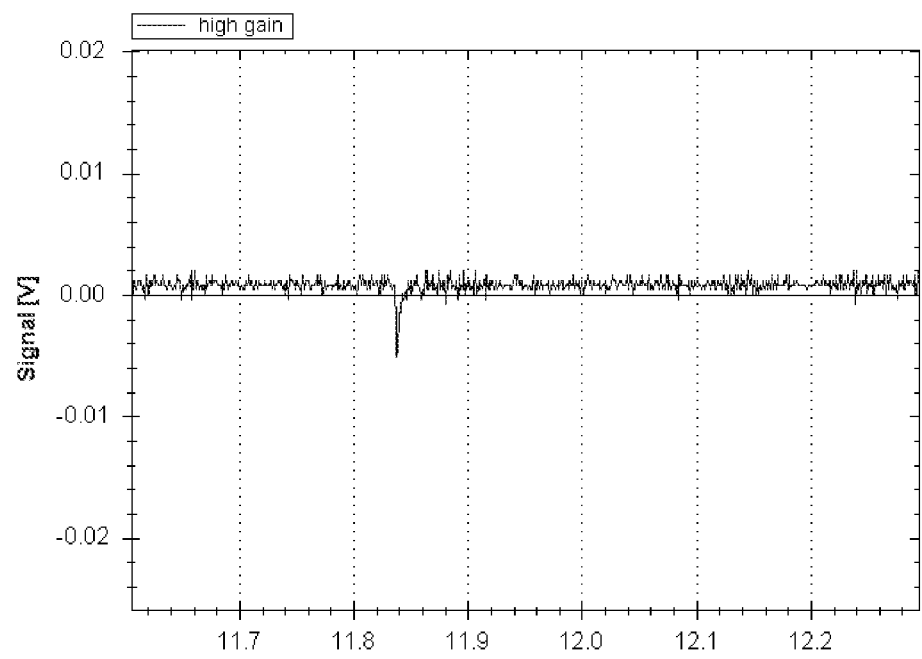
Fig. 5B (1 ion, PMT)

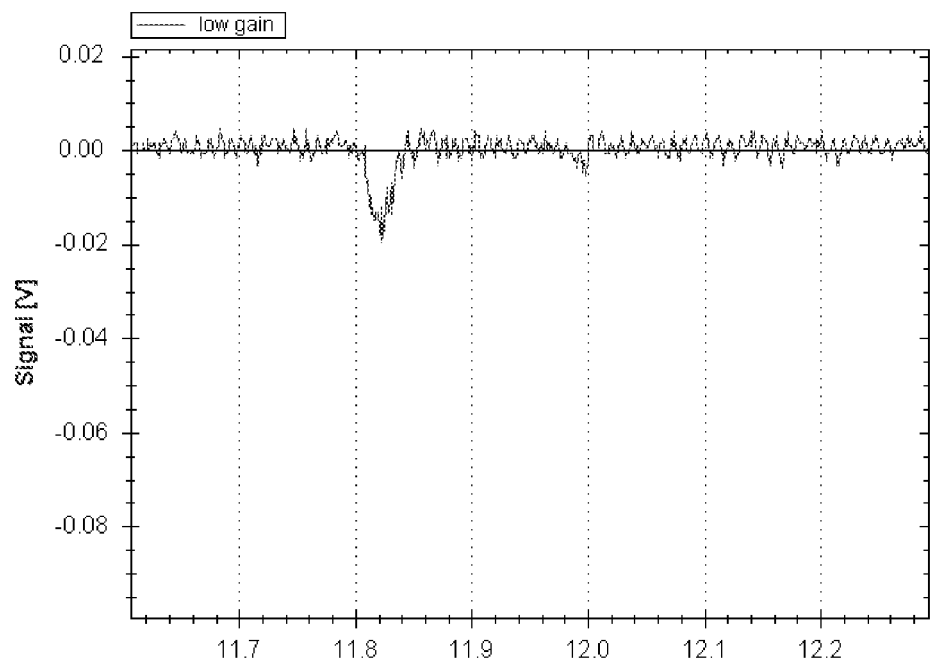
Fig. 5C (2800 ions, charge detection)
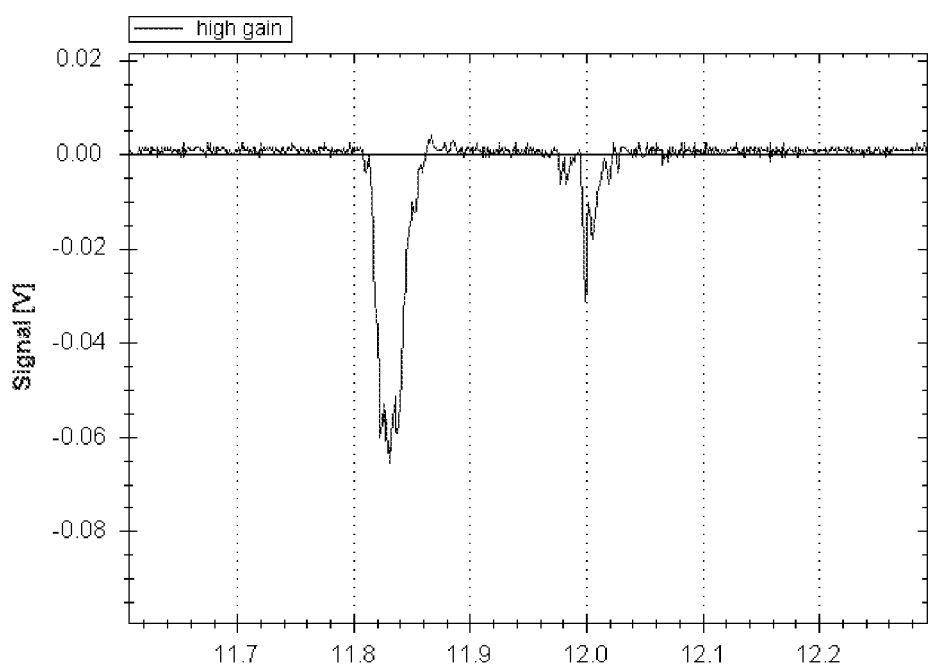
Fig. 5D (2800 ions, PMT)

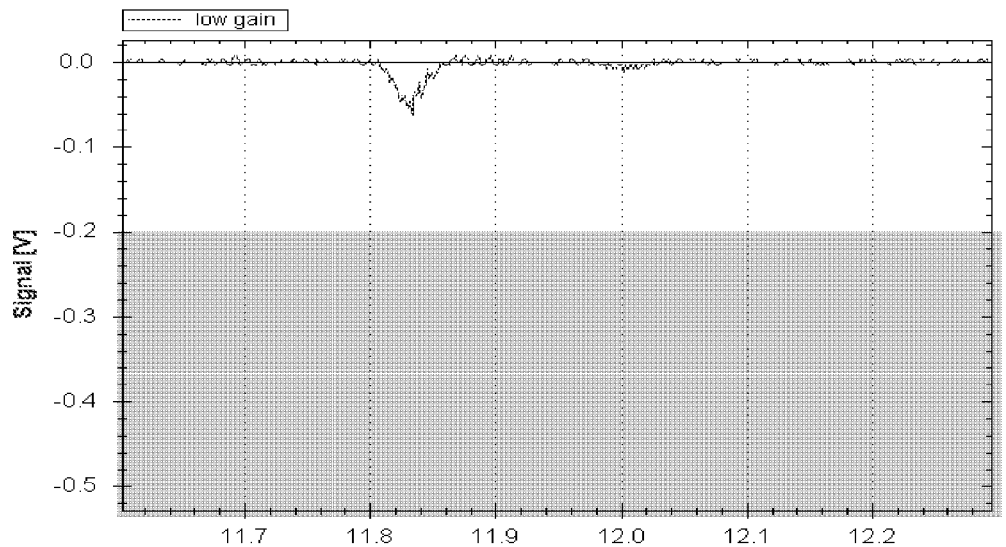
Fig. 5E (10000 ions, charge detection)
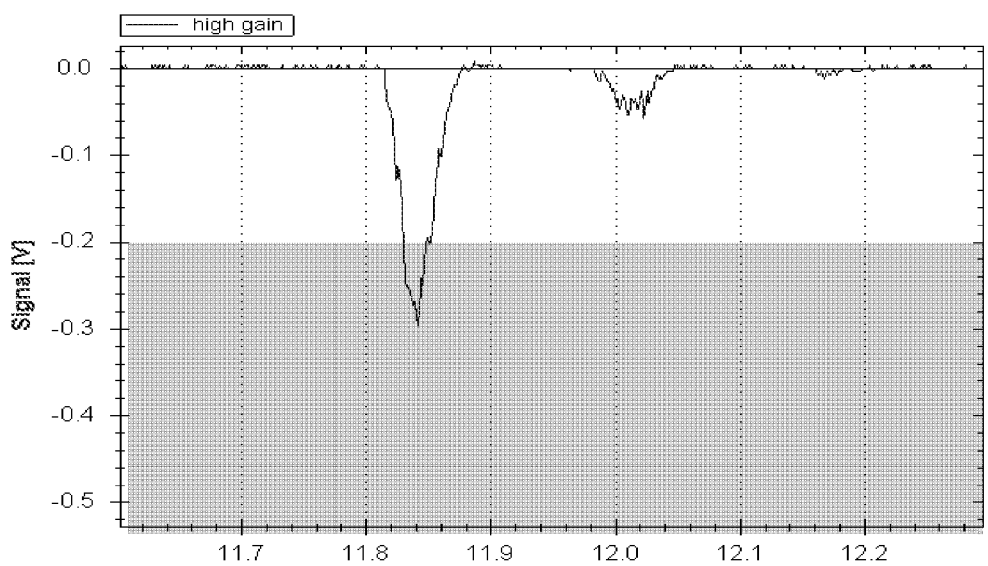
Fig. 5F (10000 ions, PMT)

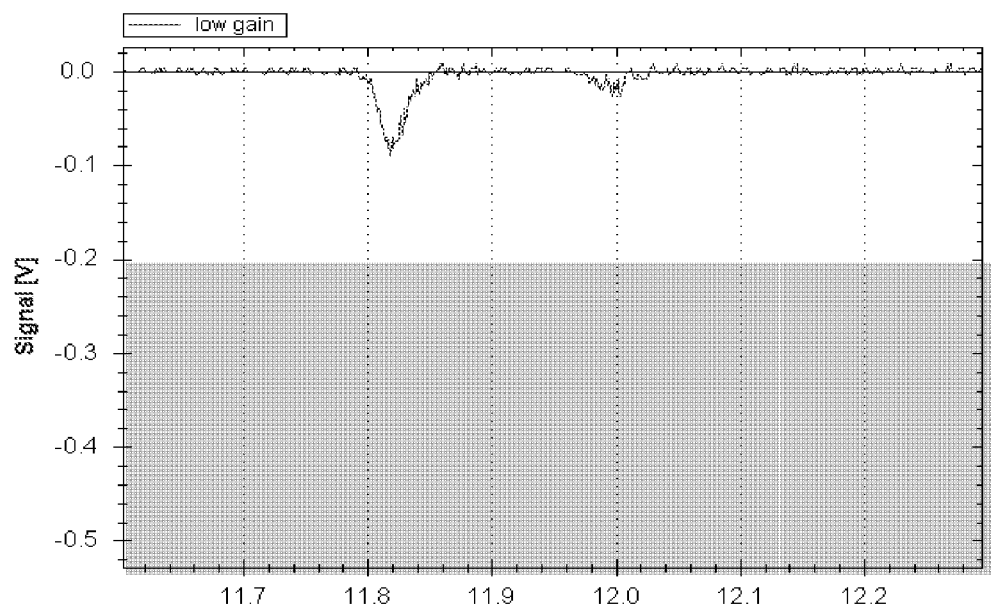
Fig. 5G (50000 ions, charge detection)
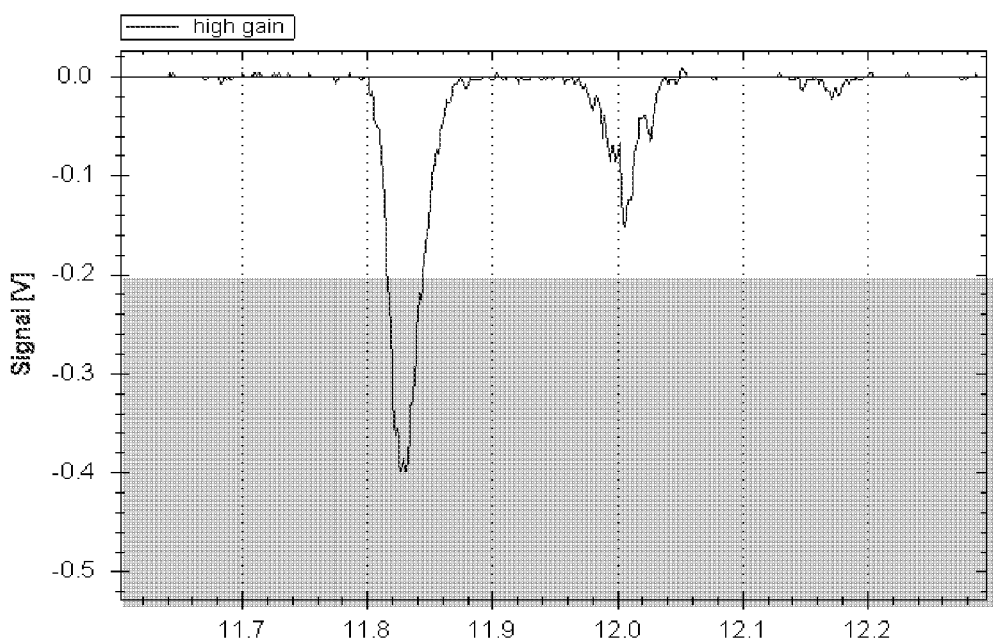
Fig. 5H (50000 ions, PMT)

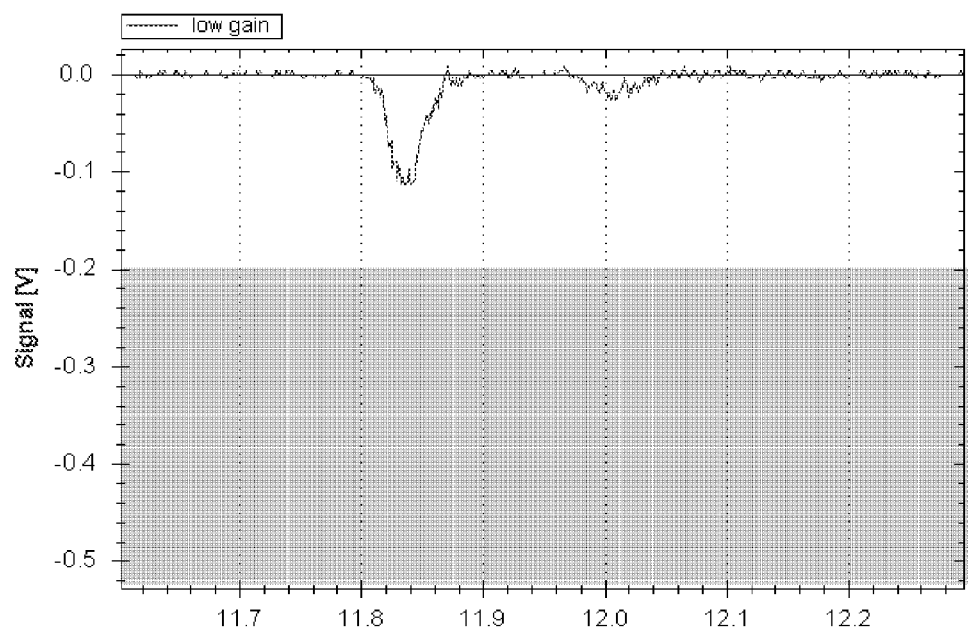
Fig. 5I (100000 ions, charge detection)
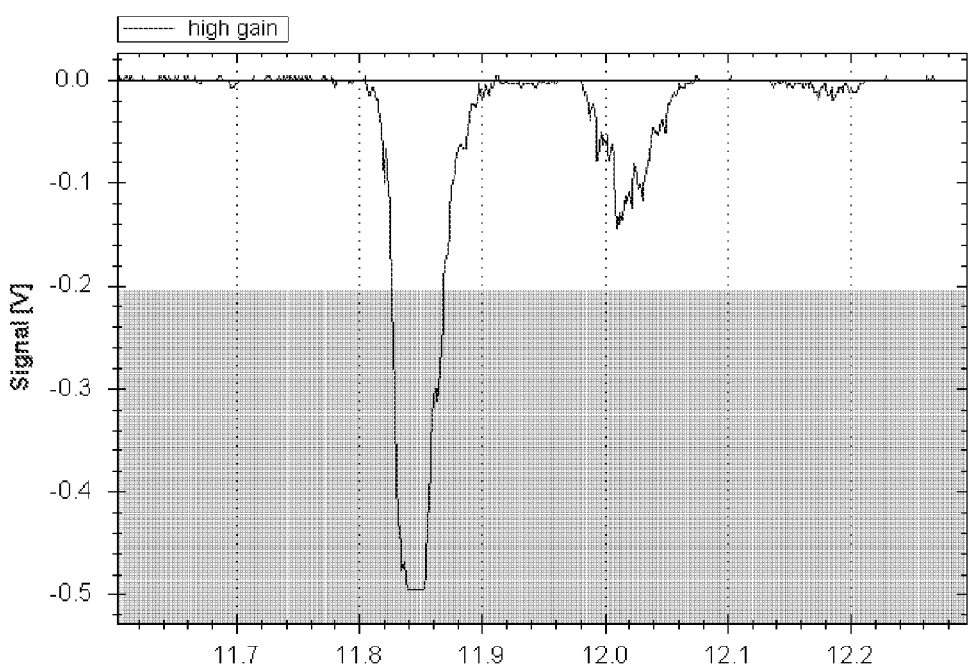
Fig. 5J (100000 ions, PMT)

DETECTION APPARATUS FOR DETECTING CHARGED PARTICLES, METHODS FOR DETECTING CHARGED PARTICLES AND MASS SPECTROMETER

FIELD OF THE INVENTION

This invention relates to detection apparatus for detecting charged particles, methods for detecting charged particles and improvements in and relating thereto. The apparatus and method are useful for a mass spectrometer or the like and thus the invention further relates to a mass spectrometer.

BACKGROUND

Charged particle detectors are used in many applications requiring, for example, ion or electron detection. One such application is mass spectrometry. Mass spectrometers are widely used to separate and analyse charged particles on the basis of their mass to charge ratio (m/z) and many different types of mass spectrometer are known. Whilst the present invention has been designed with Time-of-flight (TOF) mass spectrometry in mind, the invention is applicable to other types of mass spectrometry as well as applications other than mass spectrometry which require the detection of charged particles, e.g. electron microscopy.

Time-of-flight (TOF) mass spectrometers determine the mass to charge ratio (m/z) of charged particles on the basis of their flight time along a fixed path. The charged particles, usually ions, are emitted from a pulsed source in the form of a short packet or bunch of ions, and are directed along a prescribed flight path through an evacuated region to an ion detector. The ions leaving the source with a constant kinetic energy reach the detector after a time which depends upon their mass, more massive ions being slower. TOF mass spectrometers require ion detectors with, amongst other properties, fast response times and high dynamic range, i.e. the ability to detect both small and large ion currents including quickly switching between the two, preferably without problems such as detector output saturation. Such detectors should also not be unduly complicated in order to reduce cost and problems with operation.

Conventional ion detectors for TOF mass spectrometry comprise secondary electron multipliers, such as discrete or continuous dynode electron multipliers (e.g. micro-channel plates (MCP)). In many TOF applications, e.g. requiring the detection of high molecular weight compounds, high kinetic energies for the detected ions are needed in order for the ions to be efficiently converted to secondary ions and electrons, which can be further multiplied and detected. There are two main ways of producing high kinetic energy ions for detection in TOF mass spectrometry: (i) accelerating the ions to a high kinetic energy at the detector (e.g. by applying a high voltage such as 10-20 keV to the detector) and (ii) post-accelerating the ions prior to detection. Complications may arise from the necessary complexity of electronics which this entails, e.g. where the detector is required to float at many keV potential, and the high voltage has an effect on the detector output. One solution which has been proposed is to decouple the detector output from the detector and thereby from the high potentials by converting the electrons produced by the electron multiplier detector to photons by using a scintillator and detecting the photons using a photomultiplier. Examples of such detectors are described in U.S. Pat. No. 3,898,456, EP 278,034 A, U.S. Pat. No. 5,990,483 and U.S. Pat. No. 6,828,729. However, such detectors suffer from a relatively poor dynamic range.

An optimised ion-to-photon detector has been disclosed by F. Dubois et al (Optimization of an Ion-to-Photon Detector for Large Molecules in Mass Spectrometry; Rapid Comm. Mass Spectrom. 13. 1958-1967 (1999)) in which a post-acceleration of secondary electrons is used immediately prior to the scintillator. The detector uses a faraday collector prior to secondary electron production to intercept a portion of the incoming ion beam in order to calibrate the response of the phosphor rather than improve the dynamic range. Accordingly, this arrangement still has a dynamic range which could be improved and the approach of intercepting a portion of the beam prior to scintillation tends to reduce the ultimate sensitivity.

Proposed solutions to the problem of detector dynamic range in TOF mass spectrometry have included the use of two collection electrodes of different surface areas for collecting the secondary electrons emitted from an electron multiplier (U.S. Pat. No. 4,691,160, U.S. Pat. No. 6,229,142, U.S. Pat. No. 6,756,587 and U.S. Pat. No. 6,646,252) and the use of electrical potentials or magnetic fields in the vicinity of anodes to alter so-called anode fractions (U.S. Pat. No. 6,646,252 and US 2004/0227070 A). Another solution has been to use two or more separate and completely independent detection systems for detection of secondary electrons produced from incident particles (U.S. Pat. No. 7,265,346). A further solution has been the use of an intermediate detector located in the TOF separation region which provides feedback to control gain of the final electron detector (U.S. Pat. No. 6,674,068). The problem with the latter detection is that it requires fast change of gain on the detector and it is also difficult to keep track of the gain in order to maintain linearity. A still further detection arrangement proposed in US2004/0149900A utilises a beam splitter to divide a beam of ions into two unequal portions which are detected by separate detectors. A still further arrangement using a beam splitter and a scintillator is disclosed in WO 2009/027252 A2. Methods of combining two detector outputs are disclosed in WO 2009/027252 A2, US 2002/0175292 and U.S. Pat. No. 6,646,252. In all, these detection solutions can be complicated and costly to implement and/or their sensitivity and/or their dynamic range can be lower than desired.

An arrangement for position detection in TOF mass spectrometry is described in U.S. Pat. No. 5,969,361, which comprises a plurality of electrodes embedded in a phosphorescent layer, the electrodes being used to determine where on the detector the original ions impacted.

Accordingly, there remains a need to improve the detection of charged particles. In view of the above background, the present invention has been made.

SUMMARY OF THE INVENTION

According to an aspect of the present invention there is provided a detection apparatus for detecting charged particles comprising:

a secondary particle generator for generating secondary charged particles in response to receiving incoming charged particles;

a charged particle detector for receiving and detecting secondary charged particles generated by the secondary particle generator;

a photon generator for generating photons in response to receiving secondary charged particles generated by the secondary particle generator; and a photon detector for detecting the photons generated by the photon generator.

According to another aspect of the present invention there is provided a detection apparatus for detecting charged particles comprising:

a charged particle detector for receiving and detecting either incoming charged particles or secondary charged particles generated from the incoming charged particles;

a photon generator for generating photons in response to receiving at least some of the same incoming charged particles or secondary charged particles generated from the incoming charged particles as are received and detected by the charged particle detector; and a photon detector for detecting photons generated by the photon generator.

According to an additional aspect of the present invention there is provided a detection apparatus for detecting charged particles comprising:

a charged particle detector for receiving and detecting either incoming charged particles or secondary charged particles generated from the incoming charged particles, wherein the charged particle detector comprises an electrode which is transparent to charged particles and through which in use said incoming charged particles or secondary charged particles generated from the incoming charged particles pass;

a photon generator for generating photons in response to receiving incoming charged particles or secondary charged particles generated from the incoming charged particles which have passed through the transparent electrode; and a photon detector for detecting photons generated by the photon generator.

According to a further aspect of the present invention there is provided a method for detecting charged particles comprising:

receiving incoming charged particles;

generating secondary charged particles in response to receiving incoming charged particles;

receiving and detecting generated secondary charged particles;

generating photons in response to receiving generated secondary charged particles; and detecting generated photons.

According to a still further aspect of the present invention there is provided a method for detecting charged particles comprising:

receiving and detecting either incoming charged particles or secondary charged particles generated from the incoming charged particles;

generating photons in response to receiving at least some of the same incoming charged particles or secondary charged particles generated from the incoming charged particles as are received and detected; and detecting generated photons.

According to a still further aspect of the present invention there is provided a method for detecting charged particles comprising:

receiving and detecting either incoming charged particles or secondary charged particles generated from the incoming charged particles by passing the particles through an electrode which is transparent to charged particles;

generating photons in response to receiving incoming charged particles or secondary charged particles generated from the incoming charged particles which have passed through the transparent electrode; and detecting generated photons.

According to an additional aspect of the present invention there is provided a mass spectrometer comprising the detection apparatus according to the present invention.

According to still another aspect of the present invention there is provided a use of a detection apparatus according to the present invention for detecting ions in mass spectrometry.

According to yet another aspect of the present invention there is provided a method of improving the dynamic range of detection for a TOF mass spectrometer comprising:

receiving incoming charged particles at a detection apparatus, wherein the detection apparatus comprises at least two detectors of different gain, at least one of which detectors is a photon detector and at least one of which detectors is a charged particle detector; and detecting the incoming charged particles via the at least two detectors.

The detection apparatus is preferably a detection apparatus according to the other aspects of the invention.

The photon detector is preferably for detecting photons which have been generated from the incoming charged particles or secondary charged particles generated from the incoming charged particles. The other detector or detectors preferably comprise a further photon detector as described or more preferably a charged particle detector as herein described.

The present invention provides an apparatus and method for detecting charged particles which has a high dynamic range and which is provided by a simple and low cost arrangement of components. A high gain and low gain detection channel are provided in a detection apparatus using a simple arrangement, using robust components and limited number of expensive components. The apparatus and method is responsive to low rates of incoming charged particles down to single particle counting, i.e. has high sensitivity, e.g. provided by the use of photon detection which has the advantage of high gain and low noise due to photon detection at ground potential. The apparatus is additionally able to detect high rates of incoming particles before saturation of the output occurs, e.g. by the use of a charged particle detector of typically lower gain than the photon detector albeit with more noise. A large dynamic range is therefore achievable. A dynamic range of $10^4$-$10^5$ is achievable. Preferably, the outputs from the charged particle detector and the photon detector are adapted for combining to form a high dynamic range mass spectrum. The invention may therefore avoid the need to acquire multiple spectra at different gains in order to detect both very small and very large peaks. The charged particle detector may be capacitively decoupled from high voltage in the case of detecting negative incoming ions as described below but the signals detected by the charged particle detector are typically the strongest signals which still enable a good level of detection above the noise. The invention therefore employs at least two different types of detection in two detection channels, photon detection and charged particle detection, and the detectors of each type preferably have different saturation levels and other different characteristics. Herein, the saturation level of a detector means the arrival rate of incoming charged particles at which the output from the detector becomes saturated. A further advantage is that if one detector should fail to operate during an experimental run, at least some data may still be acquired from the remaining working detector or detectors. The apparatus of the present invention is also able to make a more efficient use of the incoming charged particles for detection than prior art apparatus and may be capable of using at least some, preferably substantially all, of the same particles for detection in both the high gain and low gain channel.

Further details of the advantages and operation of the present invention will now be described.

The charged particle detector is located at a first detection location and the photon detector is located at a second detection location, the second detection location being downstream of the first detection location. In sequence, the secondary particle generator is followed by the charged particle detector; the charged particle detector is followed by the photon detector. In sequence, in preferred embodiments, the secondary particle generator is followed by the charged particle detector, the charged particle detector is followed by the photon generator and the photon generator is followed by the photon detector.

In preferred embodiments, the charged particle detector is located at a first detection location which is substantially adjacent the photon generator. More preferably, an electrode of the charged particle detector is located substantially adjacent the photon generator. Most preferably, the electrode is located in contact with the photon generator.

The charged particle detector, e.g. the electrode thereof, is preferably located in-line with the photon detector. Thus, in the in-line arrangement the said components are either upstream or downstream of each other or integrated together. This is in contrast to the side by side arrangements as in prior art where different detectors are located side by side and detect different portions of an incoming particle beam. Such in-line arrangements and examples thereof are described in more detail below.

In preferred embodiments, the photon generator in use generates photons in response to receiving at least some of, preferably substantially, the same incoming charged particles or secondary charged particles generated from the incoming charged particles as are received and detected by the charged particle detector. In order of increasing preference, the photon generator in use generates photons in response to receiving more than 25%, more than 30%, more than 50%, more than 75% and more than 90% of the incoming charged particles or secondary charged particles generated from the incoming charged particles as are received and detected by the charged particle detector. In this way, the photon detector and the charged particle detector are configured to record at least some of the same incoming charged particles, e.g. ions. For example, the incoming charged particles may be received and detected by the charged particle detector and at least some of those same incoming charged particles, preferably substantially those same incoming charged particles, may be received by the photon generator to generate photons. This preferred configuration may equally apply in the cases where secondary charged particles are generated. For example, secondary charged particles (which are generated from incoming charged particles) may be received and detected by the charged particle detector and at least some of those same secondary charged particles, preferably substantially all those same secondary charged particles, may be received by the photon generator to generate photons. In this way, at least some of the, preferably the same, total amount of incoming charged particles is used to generate the signals at the charged particle detector as at the photon detector. In contrast, in prior art detection arrangements in which two or more detectors are used, each detector has tended to utilise a separate portion of an incoming ion beam or secondary electrons for generating signals.

In preferred embodiments, the majority (more preferably substantially all) of either the incoming particles or the secondary charged particles generated from the incoming charged particles are received and detected by the charged particle detector. In order of increasing preference, more than 25%, more than 50%, more than 75% and more than 90% of either the incoming particles or the secondary charged particles generated from the incoming charged particles are received and detected by the charged particle detector. Further preferably, the majority (more preferably substantially all) of either the incoming particles or the secondary charged particles generated from the incoming charged particles are received by the photon generator to generate photons. In order of increasing preference, more than 25%, more than 50%, more than 75% and more than 90% of either the incoming particles or the secondary charged particles generated from the incoming charged particles are received by the photon generator to generate photons. An electrode of the charged particle detector is preferably a transparent electrode for this purpose, i.e. transparent meaning that charged particles of sufficient energy are able to penetrate (i.e. pass) through it. The electrode of the charged particle detector is preferably transparent to electrons. However, the electrode is preferably not transparent to photons but rather is reflective for photons. However, in some embodiments, e.g. where the electrode of the charged particle detector is located between the photon generator and the photon detector, the electrode may be transparent to photons. Thus, the electrode may or may not be transparent to photons but preferably is not transparent to photons. Accordingly, the term transparent used herein in relation to the electrode of the charged particle detector means transparent to charged particles, unless stated otherwise. The transparent electrode picks-up the passage of the charged particles through it, e.g. for the charged particles to be detected using a charge or current meter such as a digital oscilloscope or digitiser (i.e. ADC). Accordingly, the charged particle detector preferably comprises a transparent electrode through which either the incoming charged particles or secondary charged particles generated from the incoming charged particles pass and the photon generator in use generates photons from the incoming charged particles or secondary charged particles generated from the incoming charged particles which have passed through the transparent electrode. Still further preferably, the majority (more preferably substantially all) of the photons generated are detected by the photon detector. In especially preferred embodiments, a single electrode of the charged particle detector receives the majority (more preferably substantially all) of either the incoming particles or the secondary charged particles generated from the incoming charged particles and/or a single photon detector (more especially a single PMT or APD) detects the majority (more preferably substantially all) of the generated photons. Advantageously, such embodiments enable two types of detection to be used, charged particle detection and photon detection, with consequent benefits to the dynamic range, wherein each type of detection makes use of the majority of the particles available for detection thereby providing high detection sensitivity. A dynamic range of 4 to 5 orders of magnitude has been demonstrated. All of these benefits may be provided in a simple, low-cost apparatus which uses a small number of individual detectors (e.g. one charged particle detector and one photon detector).

The apparatus of the present invention is for detecting charged particles. The charged particles to be detected are received at the apparatus for detection and are hence herein termed incoming charged particles. The charged particles may be either positively charged or negatively charged, i.e. the detection apparatus and methods are bipolar. The incoming charged particles are preferably ions and more preferably ions processed by a mass spectrometer (i.e. ions separated according to their mass to charge ratio, m/z). The ions may be inorganic or organic ions. However, the incoming charged particles may be other types of charged particles, e.g. electrons, such as electrons back-scattered in an electron microscope.

The apparatus and method of detection according to the present invention are particularly suitable for use in mass spectrometry, i.e. for the detection of ions, and hence will be described with reference to such but they may be used and provide benefit in other applications, i.e. in other measurements of charged particles such as in, e.g., particle accelerators, electron microscopy and electron spectroscopy.

The incoming charged particles to be detected may themselves impinge directly on the photon generator to generate the photons which are then detected by the photon detector. Alternatively, in preferred embodiments, the incoming charged particles are first used to generate secondary charged particles, more preferably electrons. Such a step preferably multiplies the number of incoming particles to generate a greater number of secondary charged particles. There may be one or more steps of generating secondary charged particles, e.g. the secondary charged particles may, in turn, be used to generate further secondary charged particles and so on. All charged particles generated from the incoming charged particles for impinging on the photon generator are herein referred to as secondary charged particles.

As mentioned above, the photon generator may receive the incoming charged particles directly in order to generate photons from the direct impingement thereof. Alternatively, in preferred embodiments, the photon generator is arranged to receive secondary charged particles generated from the incoming charged particles. The particles received in use by the photon generator are preferably electrons. Accordingly, preferably either the incoming charged particles or the secondary charged particles are electrons. If the incoming charged particles are not electrons, such as in the preferred embodiments where the incoming charged particles are ions, then secondary charged particles in the form of secondary electrons are preferably generated from the incoming charged particles. Accordingly, the secondary charged particles are preferably secondary electrons.

The secondary charged particles are preferably generated from the incoming charged particles by a secondary particle generator. Herein, the term secondary particle generator means any device which generates secondary charged particles in response to incoming charged particles which bombard the generator. A preferred secondary particle generator is a secondary electron generator, which generates secondary electrons in response to bombardment by the incoming charged particles. Herein, the term secondary electron generator means any device which generates secondary electrons in response to incoming charged particles which bombard the generator. Preferably, the secondary electron generator comprises a device selected from the group consisting of: a conversion dynode or a secondary electron multiplier (SEM). The SEM may be a discrete dynode SEM or a continuous dynode SEM. The continuous dynode SEM may comprise a channel electron multiplier (CEM) or more preferably a micro-channel plate (MCP). The MCP may comprise a stack of two or more MCPs as is known. The secondary electron generator most preferably comprises either a discrete dynode SEM or an MCP. Many commercial examples of secondary electron generators are known in the art for mass spectrometry. For example, suitable electron multipliers are available from Hamamatsu, including EM models such as R5150-10, R2362, R595, R596, R515 and R 474; and MCP models such as F9890-13, F9890-14, F9892-13, and F9892-14, as well as those available from Burle, Photonis and others. It will be appreciated that commercially available SEMs, such as the aforementioned models, will generally need to be modified, e.g. by removal of the anode where present, in order that the generated electrons from the SEM can be received at the photon generator. Following modification, the dynodes or MCP plates for example can be used. Some devices can be used without modification e.g. those supplied without an anode, such as the channeltron: CEM4504SL from Photonis. Due to the use of the two types of detector according to the present invention and the consequent sensitivity and dynamic range achievable, the secondary particle generator, such as an SEM, may advantageously be operated with relatively low gain, e.g. compared to conventional multipliers used in TOF mass spectrometry applications. Use of lower gain results in lower saturation limits, i.e. less shadowing of small peaks after large peaks.

One or more charged particle detectors for receiving and detecting the incoming charged particles or secondary charged particles generated from the incoming charged particles are employed by the present invention. Preferably, especially for mass spectrometry applications, the charged particle detector detects secondary charged particles (most preferably electrons) generated from the incoming charged particles (most preferably ions). In a preferred embodiment from the viewpoint of simplicity and cost, one charged particle detector is employed. In conjunction with a photon detector, one charged particle detector has been found to be sufficient to provide a fast response detection apparatus with wide dynamic range of detection.

Receiving and detecting either the incoming charged particles or secondary charged particles generated from the incoming charged particles preferably comprises picking-up the passage of the charged particles using an electrode. The passage of the charged particles may be picked up directly from the electrode (i.e. which will be the electrode which is impinged by the incoming charged particles or secondary charged particles generated from the incoming charged particles) or via an image charge induced by the electrode, e.g. on a further electrode (e.g. a sensing or capacitor plate), or via an inductive coupling. In the case of positively charged incoming ions, as described in more detail below, charge may be picked up directly, capacitively or inductively from the electrode. An arrangement using image charge detection may be used for detecting the passage of both positively and negatively charged incoming ions but will be typically used for detecting negatively charged incoming ions as described in more detail below. The charge may be also be detected from the electrode inductively, e.g. a coil or pair of coils couples the detection electrode to a digitiser. Thus, the electrode may be capacitively or inductively coupled to a digitiser. An arrangement may be used wherein the pick up of the passage of the charged particles may be switched, as required, between directly picking up the charge from the electrode (e.g. for positively charged incoming ions) and picking up the charge via a capacitive or inductive coupling electrode (e.g. for negatively charged incoming ions). This is one way in which the apparatus can be used as a bipolar detector of incoming ions. Preferably, when used as a bipolar detector, the charge is most easily picked up using a capacitive or inductive coupling. The charged particle detector thus preferably comprises an electrode, i.e. a detection electrode, for receiving the incoming charged particles or secondary charged particles generated from the incoming charged particles. If the electrode is for receiving the incoming charged particles and the incoming charged particles are ions, the electrode may be either an anode or a cathode, for receiving negatively charged ions or positively charged ions respectively. The electrode is preferably for receiving electrons as either the incoming charged particles or secondary charged particles generated from the incoming charged particles and therefore the electrode is preferably an anode for receiving electrons.

The electrode of the charged particle detector is preferably a transparent electrode, i.e. transparent meaning that charged particles of sufficient energy are able to penetrate (i.e. pass) through it. The electrode of the charged particle detector is preferably transparent to electrons. However, the electrode is preferably not transparent for photons but rather is reflective for photons. Accordingly, the term transparent used herein in relation to the electrode of the charged particle detector means transparent to charged particles. The electrode may or may not be transparent to photons but preferably is not transparent to photons.

In a preferred type of embodiment, the electrode comprises a conductive material associated with the photon generator (i.e. in close proximity thereto, preferably substantially adjacent thereto), more preferably in contact therewith, or the photon generator itself may comprise a conductive material in which case, the photon generator may comprise the electrode. For example, the photon generator may comprise a conductive polymer scintillator (i.e. a conductive polymer having one or more fluors dispersed therein) and the charge may be detected from the volume of the scintillator. In a preferred example, the electrode comprises a conductive material in the form of a conductive layer or coating adjacent the photon generator, herein termed a conductive layer. Preferably, the conductive layer is on the photon generator, i.e. on the side of the photon generator which the incoming charged particles or secondary charged particles generated from the incoming charged particles first impact (termed herein the impact side). However, in some embodiments, it may be possible to locate the conductive layer on the non-impact side of the photon generator (the conductive layer in such embodiments preferably being transparent to the generated photons). The conductive layer is preferably metallic, e.g. an aluminium, nickel or gold layer. A suitably conducting silicon layer may also be used. Where a conductive layer which is transparent to photons is required, an optically transparent conductive material such as an indium tin oxide (ITO) may be used. The conductive layer, especially a metallic layer, is preferably thin, e.g. 50 nm. Preferably, the conductive layer, especially a metallic layer, is in the range from 5 nm to 500 nm thick. In practice, the conductive layer, especially a metallic layer, is preferably at least 10 nm thick. At very low thicknesses the layer may start to become damaged by impinging particles. More preferably, the conductive layer, especially a metallic layer, is in the range from 10 nm to 200 nm thick, still more preferably from 30 nm to 100 nm thick and most preferably about 50 nm thick. The thicker the layer the higher the energy required to penetrate it. At a thickness of 50 nm or greater it will typically require electrons with kinetic energy of about 2 keV or more to penetrate the metallic layer efficiently. The choice of material and thickness of the conductive layer are preferably such as to allow the charged particles to penetrate through to the photon generator (in the preferred cases where the conductive layer is on the impact side of the photon generator), i.e. the conductive layer is preferably transparent to the charged particles to be received and detected (typically secondary electrons). Methods for coating the conductive layer on the photon generator are known in the art. For example, methods of coating a scintillator with a thin layer of metal are known in the art. The conductive layer is preferably located on the side of the photon generator where the incoming charged particles or secondary charged particles generated from the incoming charged particles are incident, i.e. the impact side. In that way, advantageously, the conductive layer, especially a metallic layer, can direct the generated photons towards the photon detector, which is typically located on the opposite side of the photon generator from the side where the incoming charged particles or secondary charged particles generated from the incoming charged particles are incident. In order to direct the generated photons, the metallic layer preferably has a reflective surface for the wavelengths of the photons generated by the photon generator. Furthermore, the use of the metal coating helps to protect the photon generator and to reduce a build-up of charge. Alternatively, the electrode may comprise a conductive material (e.g. a conductive polymer) as a matrix material of the photon generator. The use of a conductive layer or conductive material as the electrode, preferably associated or in contact with the photon generator, advantageously preferably enables substantially the same incoming charged particles or secondary charged particles generated from the incoming charged particles as are received and detected by the charged particle detector to also be used to generate photons from the photon generator. The respective surface areas of the electrode and photon generator as presented to the incoming charged particles or secondary charged particles generated from the incoming charged particles are preferably substantially commensurate with each other. The surface area of the electrode is more preferably at least as large as the surface area of the photon generator and in some cases may be larger. The surface area of the electrode is preferably sufficiently large to receive the majority (more preferably substantially all) of either the incoming particles or the secondary charged particles generated from the incoming charged particles. Similarly, the surface area of the photon generator is preferably sufficiently large to receive the majority (more preferably substantially all) of either the incoming particles or the secondary charged particles generated from the incoming charged particles in order to generate photons.

The electrode of the charge detector may be a single, integral electrode or a plurality of discrete electrodes, e.g. insulated from one another. Where a plurality of discrete electrodes are used signals from the respective electrodes may be combined or processed separately.

The electrode of the charged particle detector is preferably connected to a charge or current meter. Fast charge meters are known and preferred for the present invention, e.g. an oscilloscope or a digitiser (i.e. an analog to digital converter (ADC)) with an amplifier. In preferred embodiments, the charge meter is for detecting charge changes at a conductive layer on the photon generator as herein described. Either charge or current may be directly detected on the electrode of the charged particle detector. Alternatively or additionally, capacitive coupling or image charge detection may be used wherein the charged particle detector further comprises an image charge electrode (e.g. sensing plate) which is located in proximity and capacitively coupled to the electrode of the charged particle detector and an image charge induced in the image charge electrode by the electrode is detected. The charge may be also be detected from the electrode inductively, e.g. a coil or pair of coils couples the detection electrode to a digitiser. Thus, the electrode may be either capacitively or inductively coupled to a digitiser.

Alternatively or additionally to an electrode in the form of a conductive layer on the photon generator, the electrode may comprise an anode or dynode of the secondary electron generator (e.g. SEM) where a secondary electron generator is used. In such embodiments, the electrode detects secondary electrons generated within the secondary electron generator. In such cases, the electrode may be a dynode or a transparent anode. In such embodiments, the secondary electron generator is preferably selected from the group of secondary electron generators consisting of: a conversion dynode, a discrete dynode SEM and a continuous dynode SEM (preferably a micro-channel plate (MCP)). In such embodiments, the secondary electrons may be detected, e.g. by a current drawn from a power supply providing one or voltages to the secondary electron generator (e.g. SEM, MCP etc.), e.g. to one of the dynodes.

The electrode of the charged particle detector is preferably located in a vacuum environment, e.g. as found inside a mass spectrometer, especially a TOF mass spectrometer which may be typically $10^{-4}$ to $10^{-12}$ mbar.

A wide dynamic range is provided by the present invention by using different detector types, preferably by using charge or current detection on an electrode (or image charge detection on an image charge electrode) associated with a scintillator, preferably by detection of the charges on a metallic layer on a scintillator.

The photon generator may be any material capable of generating photons from the impingement of charged particles. One or more photon generators may be used. The photon generator preferably comprises a scintillator. A coating (e.g. a screen) of a scintillator on a substrate is a preferred configuration. Suitable scintillators are known in the art. Two or more scintillators may be used, which may be the same or different. The scintillator may be a crystal scintillator or non-crystalline scintillator. The scintillator may comprise an organic scintillator, either in crystal form or in liquid or solution form. The scintillator may comprise an inorganic scintillator, e.g. an inorganic crystal scintillator. The scintillator may comprise a plastic scintillator (i.e. an organic or inorganic scintillator (fluor) dissolved in a polymer), which may be preferable from the point of view of shaping the scintillator. Suitable commercial scintillators are available. For example, scintillators having decay times less than about 0.6 ns include Yb:YAP and Yb:LuAG and scintillators having decay times less than about 0.5 ns include Yb:Lu$_3$Al$_6$O$_{12}$, CsF, BaLu$_2$F$_8$, BaF$_2$, ZnO, and (n-C$_6$H$_{13}$NH$_3$)$_2$PbI$_4$. Complex oxide crystal scintillators include: gadolinium silicate doped with cerium (Gd$_2$SiO$_5$ (Ce) or GSO), bismuth germanate (Bi$_4$Ge$_3$O$_{12}$ or BGO), cadmium tungstate (CdWO$_4$ or CWO), lead tungstate (PbWO$_4$ or PWO) and sodium-bismuth tungstate (NaBi(WO$_4$)$_2$ or NBWO). Alkali halide scintillators crystals include: thallium doped sodium iodide NaI(Tl), cesium iodide crystals doped with thallium CsI(Tl) and cesium iodide doped with sodium CsI(Na). Other scintillators include zinc selenide ZnSe(Te). Plastic scintillators are typically fabricated from a polymer (e.g. using styrene, acrylic, and/or vinyltoluene monomer), in which a scintillating fluor has been dissolved, the most common of which are p-terphenyl, PPO, a-NPO, and PBD. A suitable commercial fast plastic scintillator product is BC-422Q (available from Saint Gobain). In some embodiments, a conductive polymer may used which may act as the electrode of the charge detector of the apparatus. The scintillator preferably comprises a phosphor, e.g. a phosphor coating, such as a phosphor screen, on a substrate. A preferred type of phosphor is an yttrium aluminium garnet or perovskite activated by cerium, more preferably YAP:Ce or YAG:Ce (Y$_3$Al$_5$O$_{12}$:Ce) or the like. A preferred commercially available example is El-Mul E36. Other phosphors include Lu$_2$SiO$_5$:Ce, YAlO$_3$:Ce, and ZnO:Ga. Coatings of such phosphors on a substrate are preferred. Preferred scintillators are chosen to have fast response times and efficient energy conversion.

A convenient configuration is to have a scintillator coating, preferably a phosphor screen, on a substrate. The substrate may be a glass body, e.g. a quartz glass body or a polymer body. The body may take the form of a plate or slab. The substrate may comprise a lens, e.g. to focus the photons generated, preferably a Fresnel lens. The lens preferably can focus the photons to a small diameter PMT or more preferably photodiode such as an APD. The smaller the APD, the faster the response, so use of a lens to focus the photons onto a smaller detector is preferable. The scintillator may conveniently be coated directly on a photon guide in some cases, i.e. where the substrate is a photon guide.

Conveniently, in embodiments, the substrate of the scintillator coating may act as a barrier or separator between the preferred vacuum environment in which the charged particle detector is preferably located and the preferred atmospheric pressure environment in which the photon detector is preferably located. Vacuum separation may alternatively be provided by another component, e.g. the scintillator itself or a photon guide.

The photon generator preferably has a conductive material (preferably a layer) on it which faces the incoming charged particles or the secondary charged particles generated from the incoming charged particles. The conductive material is preferably a conductive layer as described above which may function as an electrode of the charged particle detector. The conductive layer additionally may help to protect the photon generator, e.g. a phosphor screen, and to reflect photons produced in one direction downstream toward a photon detector.

The incoming charged particles or the secondary charged particles generated from the incoming charged particles preferably have energy greater than or equal to about 2 keV as they strike the photon generator or a conductive layer on the photon generator, more preferably energy greater than or equal to about 5 keV and most preferably energy greater than or equal to about 10 keV. The incoming charged particles or the secondary charged particles generated from the incoming charged particles are preferably accelerated (so-called post-accelerated) before impinging on the photon generator in order to improve efficiency of photon generation. The higher the kinetic energy of the charged particles impinging on the photon generator the higher the number of photons produced. For example, in some embodiments with a 50 nm thick metallic layer coated on a scintillator, it may be possible to have a multiplication of 10 or more in the number of generated photons by increasing the kinetic energy of impinging electrons from 2 keV to more than 10 keV. In the preferred embodiments wherein secondary electrons are generated in a secondary electron generator from the incoming charged particles, the secondary electrons may be post-accelerated to (in order of increasing preference) 2, 5 or 10 keV or more to impinge on a scintillator. Such post-acceleration of the charged particles preferably occurs before the charged particles impinge on the electrode of the charged particle detector. Typically, there will be at least two stages of acceleration. In one stage of acceleration, the incoming charged particles are accelerated prior to impact on the secondary charged particle generator (where one is used) (e.g. prior to impact on a conversion dynode, SEM, MCP, channeltron etc.). The important factor in that stage of acceleration is the total kinetic energy of the incoming charged particles. This kinetic energy can come from acceleration in the source of the incoming charged particles (e.g. ion source), or from a post acceleration step prior to impact on the secondary charged particle generator. Another stage of acceleration is prior to the incoming charged particles or secondary particles generated from the incoming charged particles impacting on the photon generator (preferably between any secondary particle generator and the photon generator). A higher energy of the incoming charged particles or secondary particles generated from the incoming charged particles creates more photons. Moreover, a minimum energy is required to penetrate any conductive metal layer on the photon generator.

The photon generator is preferably followed by a photon guide for guiding the generated photons toward the photon detector. The photon guide may comprise, e.g., one or more fibre optics, one or more waveguides, one or more reflective surfaces (e.g. aluminised surfaces) with or without a condensed phase material (e.g. glass) therebetween. Where no condensed phase material is present between reflective surfaces there may be a vacuum or atmospheric pressure or pressurised region between the reflective surfaces. The photon guide may be capable of changing the direction of the photons, e.g. by reflecting the photons through an angle. The photon guide accordingly may comprise, e.g., a mirror or the inner surface of a prism in order to reflect the photons through an angle. The angle may be any angle less than 180 degrees but typically is an angle of 90 degrees or less. Directing the photons to turn through an angle may be needed, e.g. because of space restrictions in the instrument such that a linear or in-line layout of components is not easy to accommodate. The use of a photon guide, in addition to efficiently transferring photons to the photon detector, may provide voltage isolation in those preferred embodiments of the invention which employ a secondary particle generator operable at high voltage. Two or more photon guides may be employed which may transfer the photons to a single photon detector or to separate photon detectors, i.e. the photon guides may split the photons into two or more portions (e.g. splitting waveguides) each portion being detected by a separate photon detector. In some embodiments, the photon generator itself may be formed so as to provide a guide for the photons towards the photon detector.

A photon detector is employed for detecting photons generated by the photon generator. One or more photon detectors may be employed. A suitable photon detector may comprise at least one of the following types: (i) a photon detector which produces an output signal from electrons generated in response to the detector receiving photons, the electrons having optionally undergone an electron multiplication; (ii) a photon detector which comprises an optical imaging device which consists of pixels. Detectors of type (ii) may additionally provide spatial information, which may be useful, e.g. on tissue imaging applications, Secondary Ion Mass Spectrometry (SIMS) analysis of surfaces, MULTUM etc. Suitable types of photon detector of type (i) include the following, for example: a photodiode or photodiode array (preferably an avalanche photodiode (APD) or avalanche photodiode array), a photomultiplier tube (PMT), charge coupled device, or a phototransistor. Solid state photon detectors are preferred and more preferred photon detectors are a photodiode (preferably avalanche photodiode (APD)), photodiode array (preferably APD array) or a PMT. More preferably, the photon detector comprises an APD or photomultiplier tube (PMT). One or more photon detectors may be employed. In a preferred embodiment from the viewpoint of simplicity and cost, a single solid state photon detector (e.g. APD or PMT) is employed. In conjunction with the charged particle detector, one solid state photon detector has been found to be sufficient to provide a fast response detection apparatus with wide dynamic range of detection. If desired, two or more photon detectors may be employed, preferably each being arranged so as to have different saturation levels. In some preferred embodiments, an array of photon detectors having different saturation levels is used for high dynamic range detection. An array may comprise two or more photon detectors, e.g. an array of photodiodes, or an array of PMTs, or an array comprising a combination of photodiodes and PMTs.

Different types of photon detector may be used in combination, e.g. a photodiode may be used in combination with a PMT. The achievement of different saturation levels may be achieved, for example, by using different types of detector, different gain on respective detectors, different attenuation and/or filtering of photons prior to detection etc. Accordingly, photon filters or photon attenuators may be used.

It is preferable to employ a photon detector, e.g. PMT, which has fast recovery characteristics following large signals and saturation. It is preferable, therefore, to include means for voltage regulation of the photon detector output. Suitable methods of improving voltage regulation and/or detector recovery time, as well as signal linearity and dynamic range, are known in the art and useful in the present invention, for example by employing circuitry (e.g. for a PMT) with Zener diodes, capacitors and/or transistors (e.g. as disclosed in U.S. Pat. No. 3,997,779, U.S. Pat. No. 5,440,115, U.S. Pat. No. 5,367,222, and US 2004/0232835A, as well as included in PMT assemblies supplied by Hamamatsu and ETP). It will be appreciated that the signal from the charged particle detector can be used during any periods of saturation, recovery or noise of the photon detector thereby allowing uninterrupted detection of the incoming charged particles.

PMTs and photodiodes are known in the art and suitable PMTs and photodiodes can be chosen to match the characteristics of the generated photons. Suitable photocathode materials for use in these include known photocathode materials, e.g. Cs—Te, Cs—I, Sb—Cs, Bialkali, Low dark Bialkali, Ag—O—Cs, Multialkali, GaAs, InGaAs. Commercial models include PMTs from Hamamatsu such as UBA and SBA type PMTs, e.g. Hamamatsu model R9880U-110; PMTs from Burle; and S8550 Si Avalanche Photodiode (APD) and other APD from Hamamatsu. The photon detector may be located in a vacuum, atmospheric pressure or elevated pressure environment. Conveniently, the photon detector is preferably located in an atmospheric pressure environment since it does not require a vacuum for effective operation. In cases where the photon detector, e.g. a PMT, is located at atmospheric pressure it is easier to replace when damaged. Another benefit of the present invention is that the dynamic range of the detection system can be split between a part inside a vacuum (e.g. inside a mass spectrometer vacuum) which can be the charge detector and a part outside the vacuum, which can be the photon detector, with the apparatus of the invention providing a reliable interface between the vacuum and atmospheric regions. Such an arrangement allows easy exchange of the more sensitive part (i.e. that part with the expected shortest lifetime which might typically be the photon detector).

The charged particle detector and photon detector most preferably have different saturation levels. Where the detectors do not inherently have substantially different saturation levels, e.g. due to their different type, or where a greater difference in saturation levels is desired, they may be arranged to have different saturation levels by various means. For example, the detectors may each have a different gain, different attenuation and/or filters applied to them etc.

The invention is useful when a high dynamic range of charged particle detection is required and also where such detection is required at high speed, e.g. as in TOF mass spectrometers. The invention is additionally useful in cases where single charged particle counting is needed. The present invention is particularly suitable for detection of ions in mass spectrometers, e.g. TOF, quadrupole, or ion trap mass spectrometers, e.g. for the determination of organic compounds, determination of active pharmacological ingredients, identification of proteins and/or peptides, identification of genotypes or phenotypes of species etc. The invention is particularly suitable for detection of ions in TOF mass spectrometers, preferably multi-reflection TOF mass spectrometers, and more preferably multi-reflection TOF mass spectrometers having a long flight path. The invention may be used with a TOF mass spectrometer wherein the peak widths (full width at half maximum height or FWHM) of peaks to be detected are up to about 50 ns wide, although in some instances the peak widths may be wider still. For example, the peak widths of peaks may be up to about 40 ns, up to about 30 ns and up to about 20 ns, typically in the range 0.5 to 15 ns. Preferably the peak widths of peaks to be detected are 0.5 ns or wider, e.g. 1 ns or wider, e.g. 2 ns or wider, e.g. 3 ns or wider, e.g. 4 ns or wider, e.g. 5 ns or wider. Preferably the peak widths of peaks to be detected are typically 12 ns or narrower, e.g. 11 ns or narrower, e.g. 10 ns or narrower. The peak widths may be in the following ranges, e.g. 1 to 12 ns, e.g. 1 to 10 ns, e.g. 2 to 10 ns, e.g. 3 to 10 ns, e.g. 4 to 10 ns, e.g. 5 to 10 ns. The invention may be used with mass analysers as described in co-pending patent application nos. GB 0909232.1 and GB 0909233.9, the contents of which are hereby incorporated by reference. It will be appreciated that the invention is applicable to known configurations of mass spectrometers including tandem mass spectrometers (MS/MS) and mass spectrometers having multiple stages of mass processing (MS"). Such mass spectrometers may employ one of many different known types of ion source, e.g. atmospheric pressure ionisation (API), electrospray ionisation (ESI), laser desorption, including MALDI etc. The mass spectrometer may be used in conjunction with other separation and/or measurement devices such as chromatographic devices (GC, LC etc.).

The charged particle detector and the photon detector preferably each comprise an output (i.e. at least one output). The charged particle detector and photon detector outputs may each provide an output signal in the form of an electrical signal the magnitude of which represents the intensity of the incoming charged particles.

The charged particle detection and photon detection may be operated simultaneously or one at a time. That is, both detectors simultaneously may generate signals for collection or only one detector at a time may generate signals for collection. Preferably, charged particle detection and photon detection are operated simultaneously.

The charged particle detector and photon detector outputs are preferably each connected to a digitiser, e.g. an analog-to-digital (ND) converter (ADC) or a digital storage oscilloscope, more preferably to separate inputs of the same digitiser. The output signals from each of the charged particle detector and photon detector are thus preferably sent to a digitiser to generate digital data. The output signals from the charged particle detector and photon detector may each be sent to a respective digitiser but preferably the signals are sent to one digitiser having two or more input channels. The digitiser is preferably a high speed digitiser as known in the art of TOF mass spectrometry for example. However, for slower speed applications a slower digitiser or electrometer may be sufficient (e.g. for quadrupole or sector mass spectrometers). The digitiser provides one or more data output signals, typically a data output signal for each detector input signal.

The outputs from the charged particle detector and photon detector, preferably as outputs from the digitiser, are preferably collected and stored as data, e.g. on a data collection and/or processing device, preferably a computer. Preferably, this is achieved by connecting the digitiser outputs to a computer. The data generated from the charged particle detector and the photon detector may be collected and/or stored separately (i.e. where data from the charged particle detector is separate from data from the photon detector) or both sets of data may be combined. The outputs or data from the charged particle detector and photon detector are preferably combined by a computer to provide one output or set of data representative of detection of the incoming charged particles. Preferably, the data from the charged particle detector and photon detector is stored as separate sets of data, e.g. within a computer, which may or may not be outputted as separate sets of data, but which are combined or otherwise processed to provide at least one further data set for storage and/or outputting (herein a processed data set). In a preferred embodiment, the data processing by the computer comprises joining the data of the charged particle detector and the photon detector so as to produce a joined data set (e.g. a high dynamic range mass spectrum). Further details of preferred methods of data joining are described below.

Outputting herein may comprise any conventional outputting such as hard copy output on paper or soft copy output on a video display unit (VDU) connected to a computer.

The data collection device in operation preferably collects and stores data from outputs of the charged particle detector and the photon detector. The collected data may be processed, such as by the data collection device. For example, the data may be processed to provide ion abundance data for a mass spectrum where the detection apparatus is part of a mass spectrometer. Such data processing is known in the art. The data, preferably after said processing, is optionally outputted.

It should be understood that the computer which collects and processes the data from the detector outputs preferably is also operably connected to the source of the incoming charged particles (e.g. mass spectrometer) so that the detector outputs can be correlated with one or more parameters of the incoming charged particles, e.g. the mass of the incoming charged particles. In this way, for example, a mass spectrum can be produced by the computer.

In the application of the apparatus of the invention to the detecting of incoming ions from a mass spectrometer in order to collect a mass spectrum, various data processing methods may be employed. Preferred methods include the following. The data collected from the detectors (e.g. via the digitiser) are preferably transferred to the computer:

1. As full profile spectra, where every single digitisation point is transferred, or
2. Reduced profile spectra, where only points belonging to peaks which values exceeds a predetermined level are transferred from the digitiser to the computer. In that way the bandwidth required for the transfer and storage of data is reduced. The predetermined level can be set for the whole length of the acquisition, or be defined for different acquisition segments, or be decided on the fly according to the signal/noise level, or using another algorithm, or
3. Only peak centroids, together with intensity information are transferred to the computer. In this case, peak centroids and other operations are carried out on the on-board computing means of the digitiser. For example an on-board computer, microcontroller, FPGA etc can be used.

The output or data acquired from one or more of the charged particle detector and the photon detector may be used for control of one or more operating parameters. In a first example of control of operating parameters of the detectors, the output or data acquired from one or more of the charged particle detector and the photon detector may be used for gain control of one or more of said same detectors. The data collection and processing means may used to implement the gain control, e.g. by a feedback process. In one such embodiment, the output or data acquired from one or more of the charged particle detector and the photon detector from one experimental run may be used for gain control of one or more of the charged particle detector and the photon detector for a subsequent experimental run. Herein, an experimental run may comprise, e.g., recording the abundances of incoming ions for a mass spectrum. For example, if the output of one or more of the detectors saturates in one experimental run at one or more peaks, as determined by the data collection and processing means, said means may lower the gain of those one or more of the detectors in a subsequent experimental run, e.g. at said one or more peaks (e.g. using a previous mass spectrum to determine when an intense peak will arrive). The gain may be adjusted in numerous ways including, e.g., adjusting one or more applied voltages to the detectors, adjusting the current of incoming charged particles or secondary charged particles, adjusting focusing of charged particles before they strike the photon detector, or adjusting of temperature or other parameters of the detectors.

It is possible to use focusing of the incoming charged particles or secondary charged particles generated from the incoming charged particles so as to vary the current of said particles which impinge on the charge detector (e.g. on the electrode thereof such as the metal layer) of the and/or photon generator. This ultimately varies the generation of photons and hence illumination of the photon detector. The focusing may be achieved by suitable ion optics, e.g. one or more ion lenses, preferably one or more ring electrodes (more preferably two or more ring electrodes). Conveniently, the mounting(s) of the secondary charged particle generator (e.g. MCP) and/or the mounting(s) of the photon generator may act as one or more ion lenses or one or more ring electrodes and may be used to provide suitable focusing by applying appropriate voltages to the mounting(s). In some operating modes, such focusing can be varied during the recording of a mass spectrum so that there is different focusing for different masses of incoming ions entering the detection apparatus, e.g. defocusing in the case of masses of ions with a high ion abundance (large detection peak), the information on ion abundance having been obtained either from the same spectrum or from a previous spectrum. A fast pulser may be used to pulse the voltage on the ion lens in such embodiments, e.g. when large peaks are going to appear. Such an operating mode may help to reduce detector saturation problems. Moreover, the operating life of the photon detector and/or scintillator may be preserved in this way.

Thus, particularly in the context of detecting ions for a mass spectrum, the gain on the detector with the highest gain can be regulated in the following ways:

1) By using a previous spectrum to determine when an intense (or weak) peak will arrive e.g. above (or below) a predetermined threshold. Then one or more of the following methods can be used:
   a) Adjusting the gain of the high-gain channel while the intense (or weak) peak is present (i.e. being detected). Reducing the gain for intense peaks may also prolong the life of the photon detector. The data from the reduced-gain high-gain channel can be used during this period or, optionally, data from the charge detector can be used during this period such that there is no need to know how much the gain was reduced;
   b) Adjusting the number of incoming charged particles or secondary charged particles generated from the incoming charged particles, hitting the photon generator (reducing the number may prolong the life of the photon generator and the photon detector), preferably by one or more of the following methods:
      i) Adjusting the focusing of the charged particles (e.g. secondary electrons) before hitting the photon generator while the intense (or weak) peak is present (i.e. being detected);
      ii) Adjusting the numbers of incoming charged particles (e.g. ions) from the incoming charged particle source (e.g. ion source) while the intense (or weak) peak is present (i.e. being detected);
      iii) Adjusting the gain on the secondary charged particle generator while the intense (or weak) peak is present (i.e. being detected).
2) By monitoring the intensity change of a peak using the detector and adjusting either the gain of the detector or the number of incoming charged particles or secondary charged particles generated from the incoming charged particles hitting the photon generator, e.g. by the methods in 1) above. Data from the charge detector can be used during this period such that there is no need to know how much the gain was adjusted. This method is more suited in the case of slower changing detector signals (e.g. from quadrupole, sector mass spectrometers) than faster changing detector signals.
3) By using the secondary particle generator (e.g. secondary electron multiplier) to detect when a large peak is arriving and adjusting either the gain of the detector or adjusting the number of secondary charged particles (e.g. electrons) hitting the photon generator while the intense (or weak) peak is present (i.e. being detected). To achieve this, methods as in 1) above may be used, for example the focusing or deflection of the secondary charged particles can be adjusted thus reducing (or increasing) their effective numbers hitting the photon generator. This requires the secondary charged particle focusing or deflection to be done on relatively slow charged particles and requires that sufficient distance (e.g. 10-20 cm) exists between the exit of the secondary particle generator (e.g. MCP, SEM) and the focusing or deflection region. The secondary particles need to be accelerated before hitting the photon generator, but after they have been reduced (or increased) in numbers.

The output or data acquired from one or more of the charged particle detector and the photon detector may be used to control the incoming ion intensity or more preferably the secondary charged particle intensity. For example, if the output from one or more of the charged particle detector and the photon detector (typically, the photon detector) becomes saturated, electronics which receives the outputs from the detectors (e.g. via a digitiser) may adjust voltages provided to, e.g., a secondary particle generator or focusing electrodes so as to reduce the intensity (i.e. current) of secondary charged particles. However, the additional complexity of such feedback may not be necessary in many instances as the detection by the charged particle detector and the photon detector can provide such a wide dynamic range that in many instances when one detector output is saturated, the other will not be saturated so that an output from at least one detector may be acquired which is representative of the intensity of the incoming particles.

The output or data acquired from one or more of the charged particle detector and the photon detector may be used for control of other operating parameters, e.g. temperature control for PMT and APD photon detectors. APDs in particular are sensitive to temperature, i.e. the gain fluctuates with temperature.

The output or data acquired from one or more of the charged particle detector and the photon detector may be used to control one or more operating parameters of the other detector.

The output or data acquired from one or more of the charged particle detector and the photon detector may be used to control one or more operating parameters of the source of incoming ions, e.g. a mass spectrometer.

According to different aspects of the present invention, there are provided an apparatus and method according to the previously described aspects wherein the charged particle detector is optional (i.e. may not be present in some embodiments). Thus, in some embodiments of these different aspects of the invention, there is no charged particle detector, e.g. no charged particle detector for detecting secondary electrons. In these different aspects of the invention, the apparatus or method comprises two or more photon detectors, e.g. photon detectors according to the preferences described herein. The two or more photon detectors preferably have different saturation levels as described herein. The two or more photon detectors may be the same or different.

BRIEF DESCRIPTION OF THE DRAWINGS

In order to more fully understand the invention, various non-limiting examples of the invention will now be described with reference to the accompanying Figures in which:

FIGS. 5A-J show mass spectra for various ion abundances recorded using the apparatus of FIG. 3;

DETAILED DESCRIPTION OF THE DRAWINGS

Figure 1:
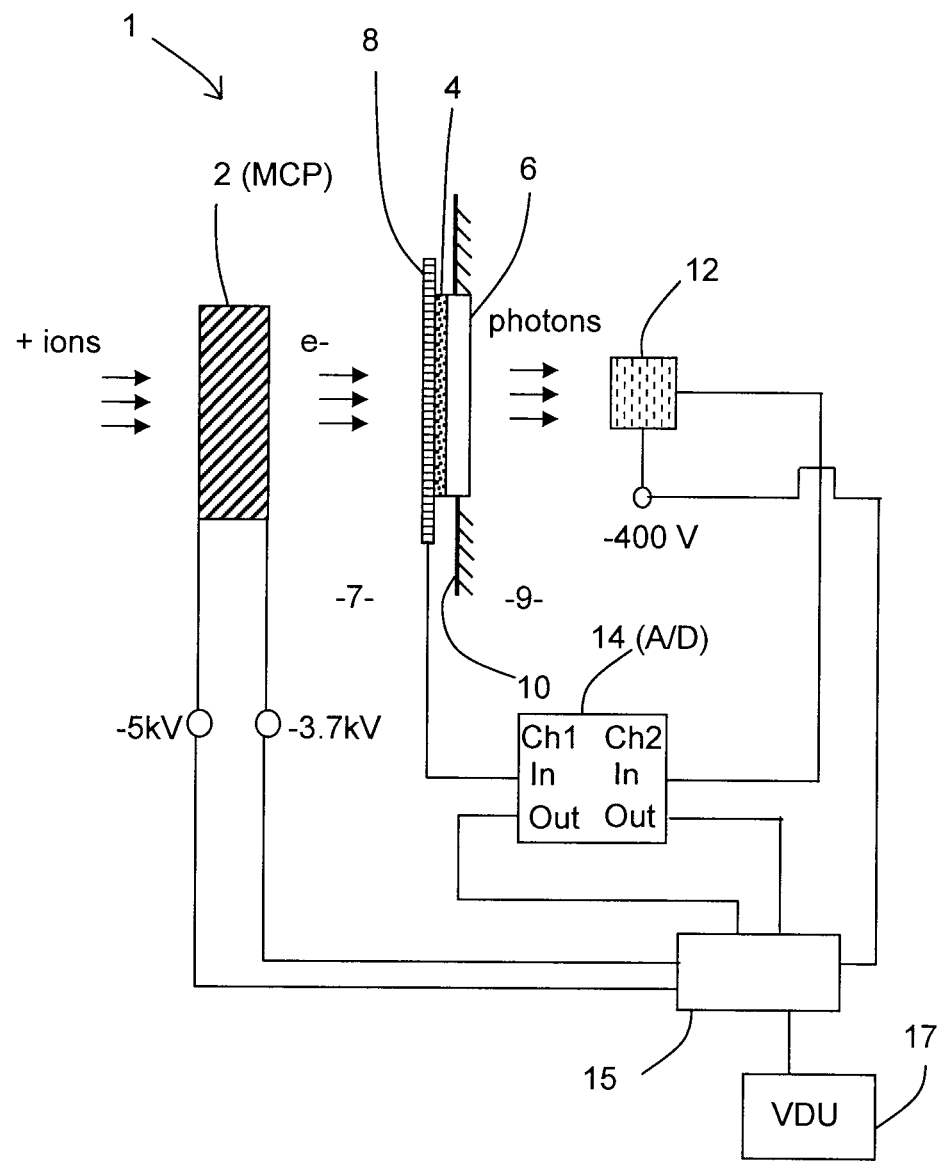
FIG. 1 shows schematically an embodiment of an apparatus for detecting charged particles according to the present invention.

Referring to FIG. 1 there is shown schematically a first embodiment of an apparatus according to the present invention. The apparatus 1 comprises a micro-channel plate (MCP) 2 to act as a secondary electron generator and generate secondary electrons (e$^-$) from incoming ions (+ ions) which are incident on the MCP 2. The MCP is a Hamamatsu F2222-21 without its usual phosphor screen. The MCP 2 is located in a vacuum environment, e.g. the vacuum environment of a mass spectrometer. The rear of the MCP 2 from which secondary electrons are emitted in operation faces a scintillator in the form of a phosphor screen 4 (model El-Mul E36), which emits photons of nominal wavelength 380 nm in response to electron bombardment. Herein, the terms the front or front side of a component means the side closest to the incoming ions (i.e. the upstream side) and the rear or rear side of the component means the side furthest from the incoming ions (i.e. the downstream side). The phosphor screen 4 is supported on its rear side by a substrate 6 in the form of a 8270 glass or quartz block of thickness 1 to 2 mm with the phosphor thereby facing the MCP 2. The quartz substrate 6 is transparent to photons of 380 nm. The phosphor screen 4 in turn has a thin layer 8 of a conductive material, in this case metal, on its front side facing the MCP 2. The combined thickness of the phosphor screen 4 and metal layer 8 is about 10 μm. The layer 8 should preferably have some electrical conductivity so a metal layer is ideal, it should preferably allow at least some transmission of electrons to the phosphor screen and it should ideally reflect photons which are generated in the phosphor screen. Other properties of the layer 8 include that is should be coatable onto the phosphor screen and doesn't evaporate in vacuum (i.e. is vacuum compatible). In this embodiment, the metal layer 8 is a 50 nm thick layer of aluminium which is thin enough to be transparent so that the secondary electrons may pass through to the phosphor 4. The metal layer 8 helps to protect and dissipate charge build-up on the phosphor as well as re-direct any photons back toward the photon detector. The layer 8 also functions in the present invention as a charge pick-up for a fast charge meter in the form of a digitiser 14 connected to it. The digitiser 14 is a Gage Cobra 2GS/s digitiser operated with two input channels, Channel 1 (Ch1) and Channel 2(Ch2) operating at 1 GS/s. Each of the input channels samples a separate detector, e.g. Ch1 for the charge pick-up from metal layer 8 and Ch2 for the PMT photon detector 12 as hereafter described. Accordingly, Ch1 provides a low gain detection channel and Ch2 provides a high gain detection channel. Preamplifiers may be used close to each of the detectors 8 and 12 before the digitiser 14 so that a gain can be adjusted to utilise the full range of the digitiser. The distance between the rear side of the MCP 2 and the front side of the metal layer 8 is 13.5 mm in this embodiment. The substrate 6 is conveniently used as separator between the vacuum environment 7 in which the vacuum operable components such as the MCP 2, metal layer 8 and phosphor 4 are located and the atmospheric environment 9 in which the photon detector and data processing device are located as hereafter described. For example, the substrate 6 may be mounted in the wall 10 of a vacuum chamber (not shown) within which chamber are located the vacuum operable components. As will be evident from FIG. 3 described below, the vacuum may be the vacuum of a mass spectrometer or other analysing device. Downstream of the phosphor screen 4 and its substrate 6 is a photon detector in the form of a photomultiplier tube (PMT) 12, which in this embodiment is model no. R9880U-110 from Hamamatsu. The rear side of substrate 6 is separated from the front side of a PMT 12 by a distance of 5 mm. The output signal of the PMT 12 is fed to the input of second channel (Ch2) of the digitiser 14 which thereby provides a high gain detection channel of the apparatus. The outputs of the digitiser channels Ch1 and Ch2 (comprising digital signals derived from the inputs of detection channels Ch1 and Ch2 respectively) are fed to a computer of a unit 15 (Dell Precision T7400) for data storage and/or processing. The unit 15 also comprises the voltage supply for the MCP 2 and PMT 12. The computer of unit 15 is connected to a VDU screen 17 for graphical display of acquired and/or processed data. In some embodiments, the computer of unit 15 may also be connected via suitable controllers so as to control the voltage supply within unit 15 for MCP 2 and PMT 12, e.g. to independently control the gain of these. Ancillary and intermediate devices in the circuits, including power supplies, amplifiers, etc. will be apparent to the person skilled in the art and are not shown for simplicity in FIG. 1. The computer of unit 15 may also be optionally connected (connection not shown) to a controller of the source of the incoming ions, e.g. mass spectrometer, so as to be able to control the current of incoming ions as well as the energy of the ions. It will be appreciated that computer of unit 15 may be operably connected to any other components of the system in order to control such components, e.g. components requiring voltage control.

In operation, the incoming ions, which in this example are positively charged ions (i.e. the apparatus is in positive ion detection mode), are incident on the MCP 2. It will be appreciated, however, that by using different voltages on the various components the apparatus may be set up to detect negatively charged incoming ions. In a typical application, such as TOF mass spectrometry, the incoming ions arrive in the form of an ion beam as a function of time, i.e. with the ion current varying as a function of time. The front (or incident) side of the MCP 2 is biased with a negative voltage of −5 kV to accelerate the positively charged incoming ions. The rear of the MCP 2 is biased with a less negative voltage of −3.7 kV so that the potential difference (PD) between the front and rear of the MCP is 1.3 kV. Secondary electrons ($e^-$) produced by the MCP 2 are emitted from the rear of the MCP. The MCP 2 has a conversion ratio of ions into electrons of about 1000, i.e. such that each incident ion produces on average about 1000 secondary electrons. In positive ion detection mode as in this example, the metal layer 8 is held at ground potential so that the PD between the MCP 2 and the layer 8 is 3.7 kV. Changes in the charge at the metal layer 8 induced as the secondary electrons strike and travel through it are picked-up by the digitiser 14 via input Ch1 which in turn produces a respective digital output electrical signal. The digitiser output signal is fed to the computer of unit 15 which stores it as data. The arrangement of the invention enables substantially all of the incoming ion beam which enters the MCP 2 to be utilised to generate secondary electrons and the passage of substantially all of the secondary electrons from the MCP 2 to be picked-up by the metal layer 8 and thereby associated digitiser 14. The secondary electrons have sufficient energy to penetrate the metal layer 8 and strike phosphor screen 4 and produce photons which in turn travel downstream, aided by reflection from metal layer 8, to be detected by PMT 12. The arrangement of the invention enables substantially all of the secondary electrons from the MCP 2 to be used to produce photons from the phosphor 4. Thereafter, substantially all of the photons may be detected by the PMT 12. An output signal from PMT 12 is fed to input Ch2 of the digitiser 14 which in turn produces a respective digital output electrical signal. The digitiser output signals from Ch1 and Ch2 are fed to the computer of unit 15 which stores them as data and performs data processing and/or data outputting. The invention thus advantageously does not depend on splitting the ion or electron beam into two or more smaller fractions and detecting the fractions but rather at least some of the same charged particles (in this case secondary electrons) which are detected by the arrangement as charge also produce photons which are then also detected. This results in a more efficient charged particle use and sensitive detection.

In one particular data processing mode, the computer of unit 15 combines each of the digital output signals from the low gain Ch1 and high gain Ch2 channels of the digitiser to provide one signal representing the total signal of both channels. In a preferred data processing mode, the computer of unit 15 joins each of the digital output signals from the low gain Ch1 and the high gain Ch2 channel of the digitiser in such a way that the signal used for final output is from the high gain channel except for data points where the signal from the high gain channel is saturated at which points the signal from the lower gain channel which is not saturated is used but is scaled to fit the scale of the higher gain channel (e.g. the low gain signal is scaled, i.e. multiplied, by a factor of x where the high gain channel provides a signal which is a factor of x greater than the low gain channel for a given number of incoming ions, i.e. x is the amplification of the high channel over the low gain channel). Other data processing modes are known for the processing of data from two input channels and will be apparent to the person skilled in the art.

According to a yet further aspect of the present invention, there is advantageously provided a method of recording a high dynamic range mass spectrum of incoming charged particles comprising:

detecting the incoming charged particles directly or indirectly at a relatively low gain detector and generating a low gain output from said relatively low gain detector;

detecting the incoming charged particles directly or indirectly at a relatively high gain detector and generating a high gain output from said relatively high gain detector;

combining the low gain output and the high gain output to form a high dynamic range mass spectrum.

The method preferably comprises detecting at least some of the same incoming charged particles directly or indirectly at the relatively high gain detector as detected directly or indirectly at the relatively low gain detector. More preferably, at least 30%, at least 50% or at least 75% of the same incoming charged particles are detected directly or indirectly at the relatively high gain detector as are detected directly or indirectly at the relatively low gain detector.

Other data processing steps, e.g. data filtering steps, may be performed as required and as known in the art prior to forming the high dynamic range mass spectrum. The relatively low gain detector is preferably a charged particle detector as described herein. The relatively high gain detector is preferably a photon detector as described herein. The charged particle detector and the photon detector are more preferably part of a detection apparatus according to the other aspects of the present invention. The step of combining the low gain output and the high gain output to form the high dynamic range mass spectrum preferably comprises using the high gain output to form the high dynamic range mass spectrum for data points in the mass spectrum where the high gain output is not saturated and using the low gain output to form the high dynamic range mass spectrum for data points in the mass spectrum where the high gain output is saturated. For data points in the mass spectrum where the low gain output is used to form the high dynamic range mass spectrum, the low gain output is preferably scaled by the amplification of the relatively high gain detector to the relatively low gain detector to form the high dynamic range mass spectrum.

References herein to a mass spectrum include within their scope references to any other spectrum with a domain other than m/z but which is related to m/z, such as, e.g., time domain in the case of a TOF mass spectrometer, frequency domain etc.

Figure 2A:
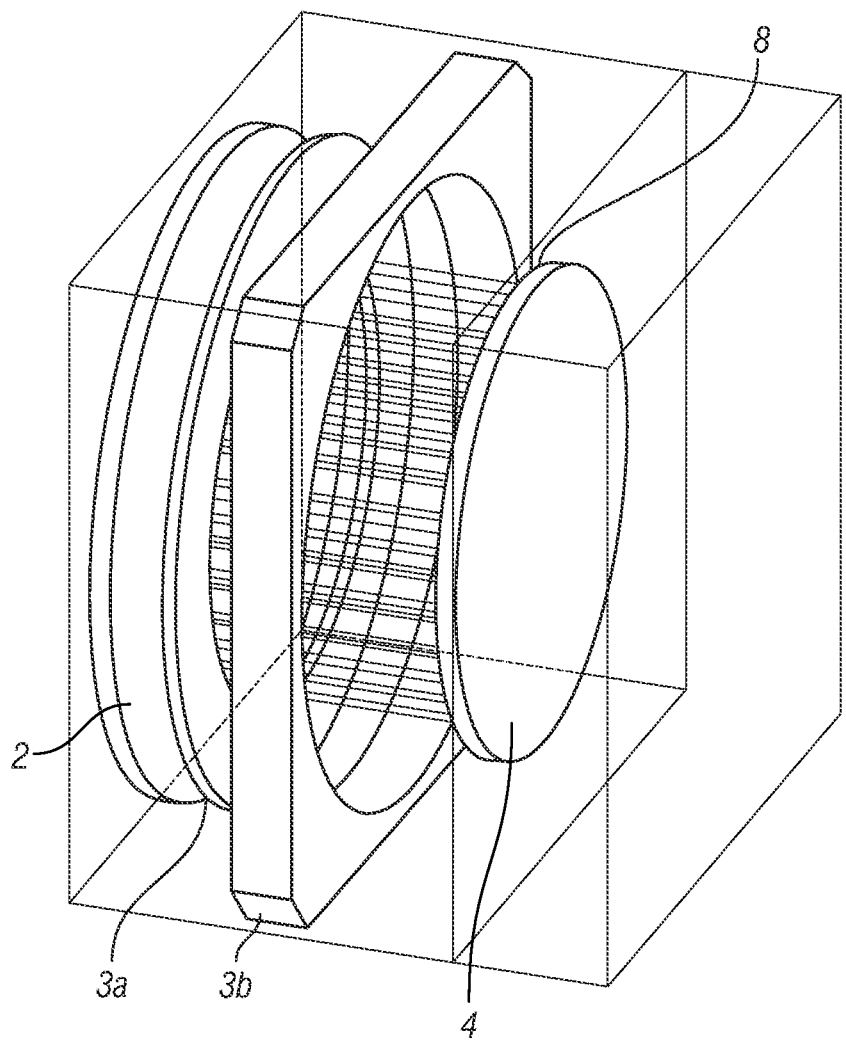
FIGS. 2A-D show schematically embodiments of parts of an apparatus according to the present invention which enable focusing of charged particles onto the charge detector and photon generator.
Figure 2B:
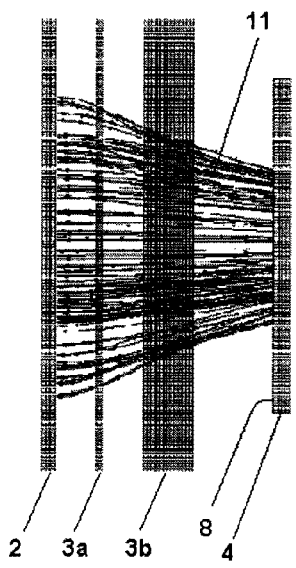
Figure 2C:
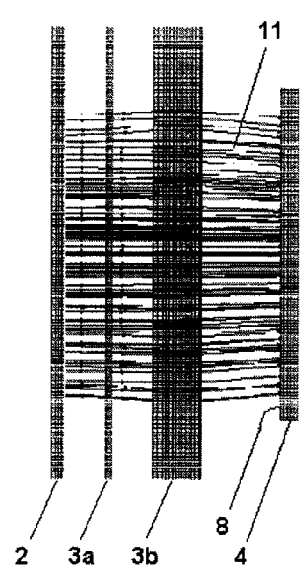
Figure 2D:
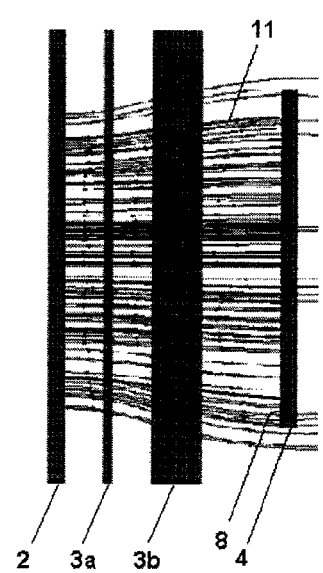

In a preferred embodiment of the apparatus shown in FIG. 1, focusing may be used to focus charged particles (either incoming charged particles or secondary charged particles generated from the incoming charged particles) onto the charge detector and/or photon generator. With reference to FIG. 1 such focusing is preferably performed between the rear of the MCP 2 and the metal layer 8 on the phosphor screen 4. Such focusing is achieved by ion optics and the ion optics may conveniently be provided by the mounting or casing of the MCP 2. Such an embodiment is shown schematically in FIG. 2A which shows the rear of the MCP 2 and the phosphor screen 4 having metal layer 8 thereon facing the MCP 2. Intermediate the MCP 2 and metal layer 8 are ion optical ring electrodes 3a and 3b, which in practice can be separate parts of the casing for the MCP 2. Alternatively, ring electrodes 3a and 3b can be stand alone components (i.e. not part of the MCP casing or another casing or mounting). The ring electrodes 3a and 3b have voltages applied to them to focus the particles. The ring electrodes 3a and 3b may have voltages independently applied to them (i.e. independently from each other and independently from the MCP 2) or conveniently may have the same voltage applied to them depending on the focusing requirements. The voltages applied to ring electrodes 3a and 3b may be chosen to suitably focus the secondary electrons from the MCP 2 as they travel through the rings 3a and 3b to the metal layer 8. By adjustment of the voltages on the ring electrodes 3a and 3b focusing can be varied so that different areas of the metal layer 8 are illuminated with secondary electrons and/or different secondary electrons currents are received at the metal layer. In some embodiments, the voltages on the ring electrodes 3a and 3b can be varied during the recording of a mass spectrum so that there is different focusing for different masses of incoming ions entering the detection apparatus, e.g. defocusing in the case of masses of ions with a high ion abundance (large detection peak), the information on ion abundance having been obtained either from the same spectrum or from a previous spectrum. A fast pulser may be used to pulse the voltage on the rings 3a and 3b in such embodiments, e.g. when large peaks are going to appear. Such an operating mode may help to reduce detector saturation problems. Moreover, the operating life of the photon detector and/or scintillator may be preserved in this way. In FIGS. 2B-D are shown schematic side cross-sectional views of the FIG. 2A set-up illustrating examples of different electron focusing which can be achieved using a focusing arrangement as shown in FIG. 2A. The different trajectories of the secondary electrons are shown by lines 11. In all the cases shown in FIGS. 2B-D, the voltage applied to the rear of the MCP 2 is −3700V, the metal layer 8 and the phosphor 4 are at ground potential. The ring electrodes 3a and 3b are connected together to the same voltage which has the following values in the different Figures:

FIG. 2B voltage (3a,3b)=−3700V
FIG. 2C voltage (3a,3b)=−2900V
FIG. 2D voltage (3a,3b)=−2000V In FIG. 2B, the secondary electrons 11 are focused to a significantly smaller area of the metal layer 8 and phosphor 4 than the total area. In FIG. 2C, the secondary electrons 11 are focused to utilise the great majority of the area of metal layer 8 and phosphor 4. In FIG. 2D, the secondary electrons 11 are defocused so that some of the electrons pass outside the area of metal layer 8 and phosphor 4, e.g. which may be used when the electron current is high. The focussing of the secondary electrons in this way may also affect the time focusing of the electrons. The time focusing is preserved well in the focusing shown in FIG. 2C and is also good in the FIG. 2D case. In the FIG. 2B case however, the time focusing is less good.

Figure 3:
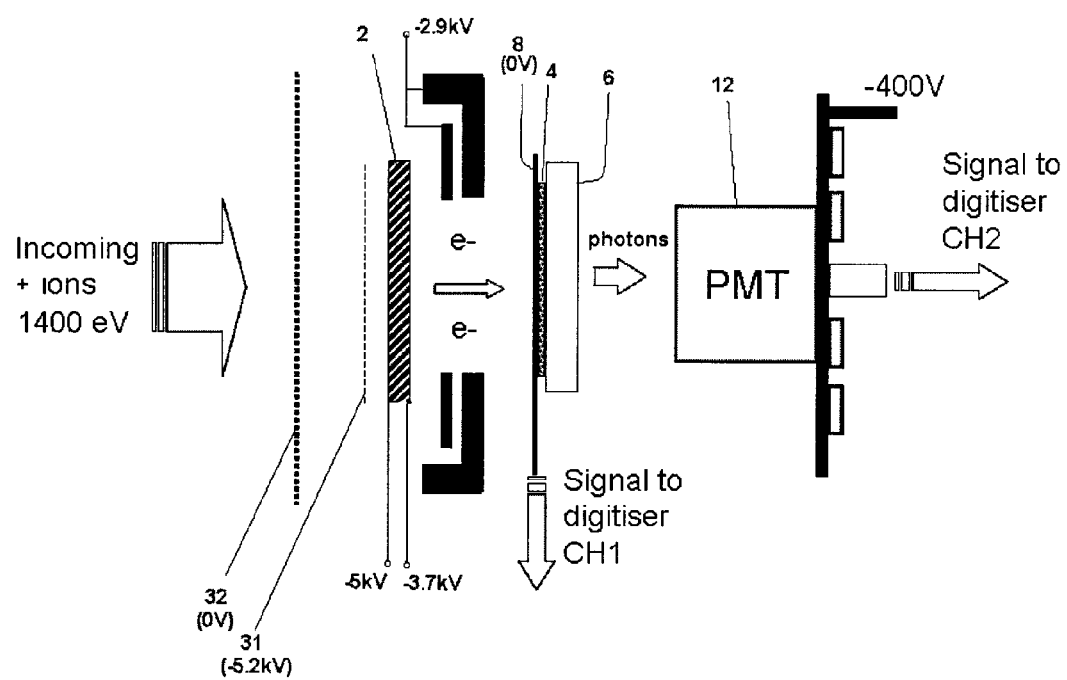
FIG. 3 shows schematically a further embodiment according to the present invention.

A further example of an apparatus according to the present invention is shown schematically in FIG. 3 in which like components to those shown in FIGS. 1 and 2A-D have been given like reference numerals. Certain components of the apparatus such as the digitiser 14 and unit 15 are not shown in FIG. 3 but they are the same as shown in FIG. 1. The apparatus of FIG. 3 is largely the same as the apparatus shown in FIG. 1 except that ring electrodes 3a and 3b are included to which a −2900V voltage is applied in use, the electrodes 3a and 3b being conveniently constituted in this example by rings of the casing of the MCP 2. The voltage applied to the electrodes 3a and 3b is controlled by the computer of unit 15 (not shown in FIG. 3) similarly to other voltages of the system. The apparatus also employs a grid 32 which in use is held at ground potential to define the TOF region of a TOF mass spectrometer and a grid 31 held at −5200V to restrict secondary electrons from the MCP 2 from entering the TOF region and from striking grid 32 to generate secondary ions that may go towards the MCP 2 and give rise to ghost peaks.

Figure 4:
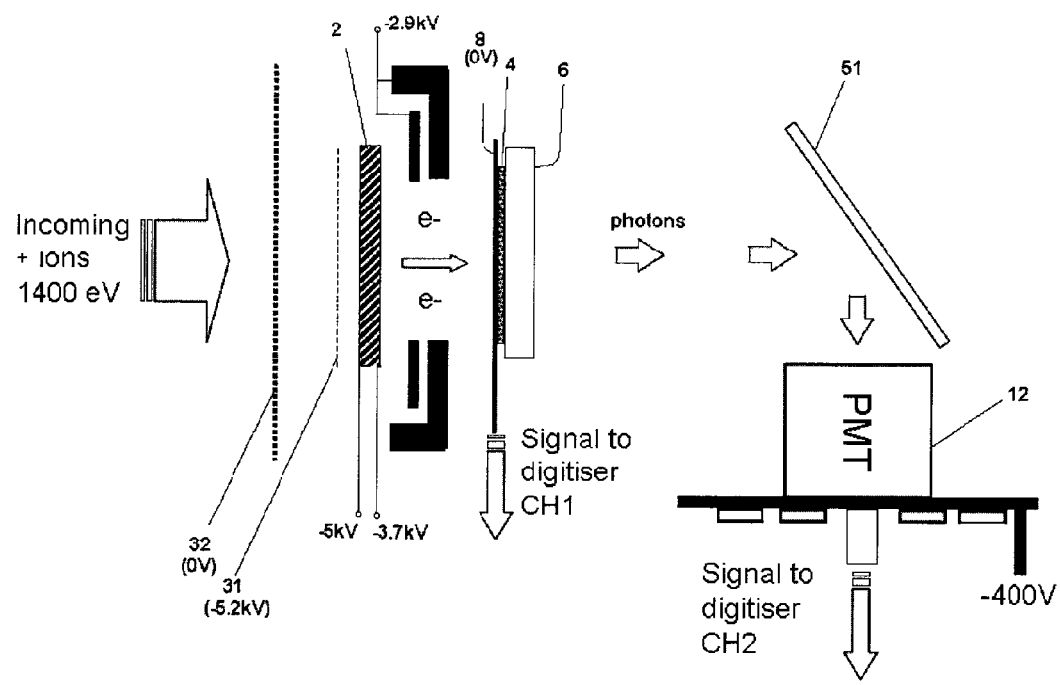
FIG. 4 shows schematically another embodiment according to the present invention.

A variation of the apparatus shown in FIG. 3 is shown in FIG. 4 which differs from the apparatus shown in FIG. 3 in that the photons are reflected through an approximately 90 degree angle by a mirror 51 to reach the PMT 12. Such a deflection, or some other deflection, of the photon beam may be employed in order to accommodate all of the components of the apparatus within a confined space, such as in a mass spectrometer for example.

Due to their different detection characteristics, the metal layer 8 connected to digitiser input Ch1 constitutes a detection channel of effectively different gain to the PMT 12 connected to digitiser input Ch2. The metal layer 8 provides a relatively low gain detection channel and the PMT 12 provides a relatively high gain detection channel. Utilisation of a transparent metal layer upstream of the scintillator allows substantially all of the secondary electrons to be used for both charge detection and photon generation, which, in turn, provides enhanced sensitivity and wide dynamic range in a simple, low cost arrangement of components.

An illustration of the dynamic range achievable using the apparatus and voltages as described above with reference to FIG. 3 is demonstrated with reference to FIGS. 5A-5J. FIGS. 5A-5J show TOF mass spectra (signal intensity vs. time (µs)) of a singly positively charged caffeine ion with a 10 Da window (+/−5 Da) recorded using the apparatus shown in FIG. 3. The FIGS. 5A and 5B show the spectra recorded for a single incoming ion for each of the low gain, charge detection channel (Ch2) (FIG. 5A) and the high gain, PMT channel (Ch1) (FIG. 5B); FIGS. 5C and 5D show the spectra recorded for 2,800 incoming ions for each of the low gain, charge detection channel (FIG. 5C) and the high gain, PMT channel (FIG. 5D); FIGS. 5E and 5F show the spectra recorded for 10,000 incoming ions for each of the low gain, charge detection channel (FIG. 5E) and the high gain, PMT channel (FIG. 5F); FIGS. 5G and 5H show the spectra recorded for 50,000 incoming ions for each of the low gain, charge detection channel (FIG. 5G) and the high gain, PMT channel (FIG. 5H); and FIGS. 5I and 5J show the spectra recorded for 100,000 incoming ions for each of the low gain, charge detection channel (FIG. 5I) and the high gain, PMT channel (FIG. 5J). The detector in practice, for the arrangements shown in FIGS. 1, 3 and 4 is typically operated with the digitiser having a range of +/−200 mV for optimum dynamic range and the detection of single ions. As the digitiser range is increased, the noise of the baseline increases which makes it harder to detect single ions. For the spectra in FIGS. 5A-D a digitiser range of +/−200 mV was used. However, for the spectra shown in FIGS. 5E-5J, a higher range of +/−500 mV was used simply in order to demonstrate how large the peaks can be. The greyed out area for signals below the dotted line shown at 200 mV (i.e. 0.2V) illustrates where the PMT detector would have been clamped by the digitiser if a range of +/−200 mV had been used, with the white area for signals up to 200 mV showing the region having a substantially linear response of the photodetector. The much greater gain of the PMT channel (compared to the charge detection channel) can be seen to offer sensitivity to a single ion whilst at high ion abundances, where the PMT channel output saturates, i.e. is clamped by the digitiser, the low gain charge detection channel provides a non-saturated output. In practice, the outputs of the two channels are typically combined to produce final spectra.

Figure 5K:
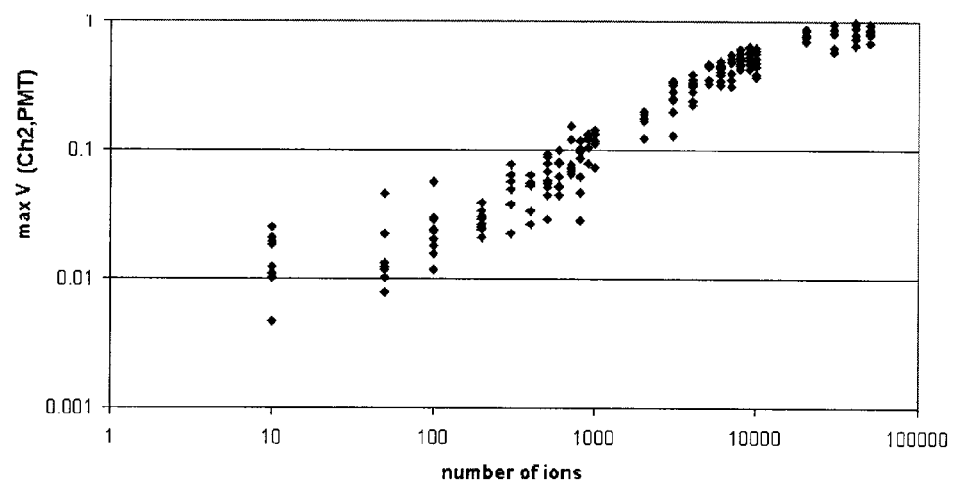
FIG. 5K shows a plot of the output of the high gain channel of the apparatus of FIG. 3.
Figure 5L:
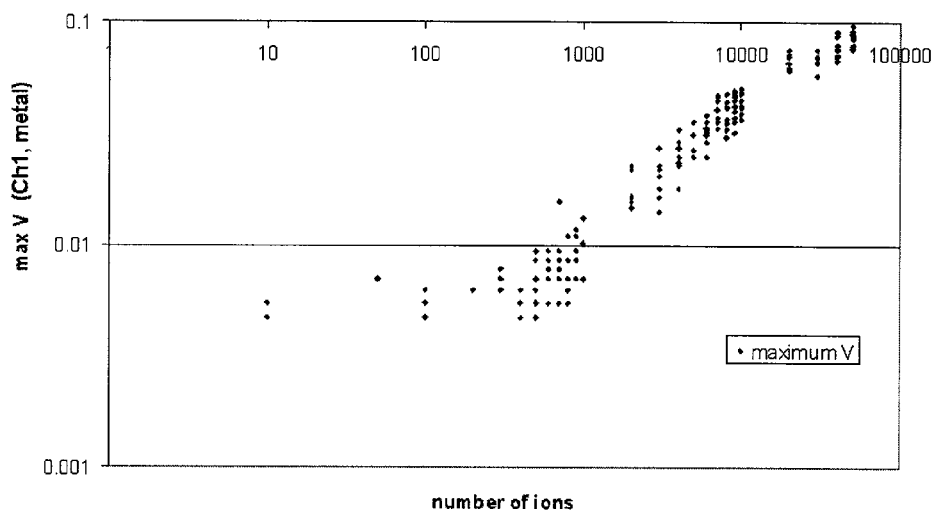
FIG. 5L shows a plot of the output of the low gain channel of the apparatus of FIG. 3.
Figure 5M:
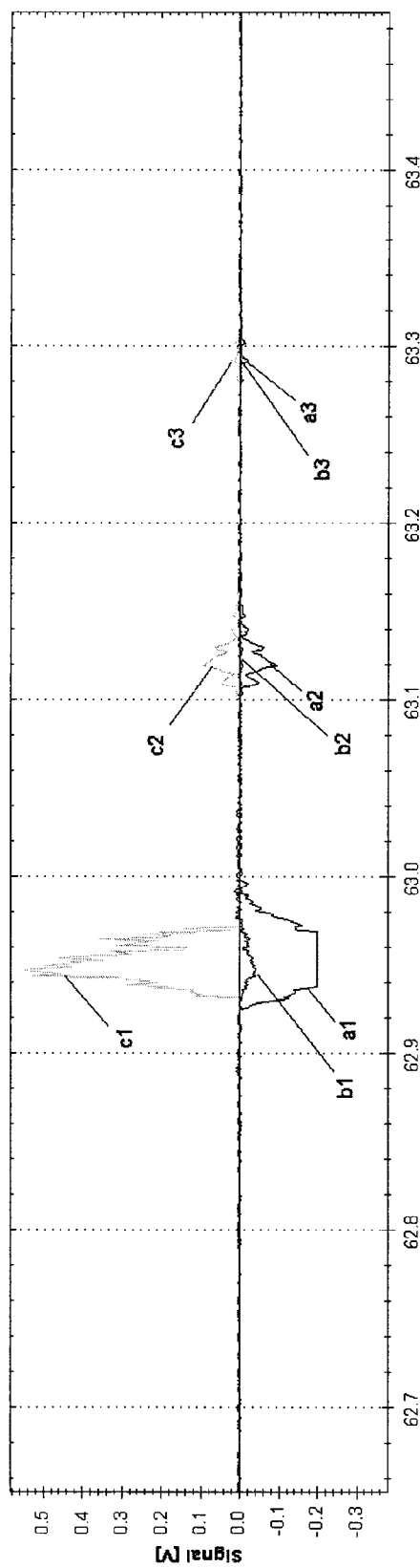
FIG. 5M shows the joining of data from two different detection channels of an apparatus according to the present invention.

A dynamic range possible with the present invention is further illustrated with reference to FIGS. 5K and 5L. FIG. 5K shows a plot of the output of the high gain channel (Ch2), i.e. from the PMT detector, of the apparatus of FIG. 3. Similarly, FIG. 5L shows a plot of the output of the low gain channel (Ch1), i.e. from the charge detector. The plots in FIGS. 5K and 5L show the voltage (max V) of the respective outputs versus the number of incoming ions. The two plots show experimental data recorded from Ch1 and Ch2 simultaneously. The number of incoming ions plotted is not the actual number of ions hitting the detectors but rather a nominal number of incoming ions which the mass spectrometer as the incoming ion source was requested to supply. Consequently, for each number of ions there is a spread of output voltages, especially at low number of ions, because of the inability to accurately control the number of incoming ions from one run to the next and because of the statistical nature of secondary particle production in the MCP, the phosphor and the PMT. It can be seen that for the digitiser range of +/−200 mV (i.e. 0.2V), which is desirable from the viewpoint of registering single ions, the high gain PMT channel shown in FIG. 5K can practically cover the detection of from 1 ion up to about 1000 ions while the low gain charge detection channel shown in FIG. 5L can cover the detection of from 1000 ions up to 10,000-100,000 ions. Consequently, with the two detection channels operating simultaneously, a dynamic range of $10^4$-$10^5$ is achievable, i.e. up to 5 orders of magnitude for recording a TOF mass spectrum. The high sensitivity achievable with the detection system (down to a single ion) may permit fragmentation spectra from ions to be obtained without the need to accumulate spectra. Data acquired from the detection apparatus of the invention may be processed in numerous ways as described herein. In one method of data processing, the data from the different detection channels may be simply combined (joined). A preferred method of data joining from the two detection channels is shown in FIG. 5M using data acquired on an apparatus as shown in FIG. 3. FIG. 5M presents a small selected portion of the TOF mass spectrum of caffeine (intensity vs. time (μs)). The FIG. 5M shows below the horizontal axis both the data from the high gain PMT channel (Ch2) with peaks shown for the monoisotopic peak (a1), first isotopomer (a2) and second isotopomer (a3) as well as the data from the low gain charge pick-up channel (Ch1) with peaks similarly shown for the monoisotopic peak (b1), first isotopomer (b2) and second isotopomer (b3), although b2 and b3 are hard to discern. The low gain channel output signal is typically shifted on the time axis in order to match the high gain channel. The data from the two channels are joined by means of the computer of unit 15 which stores and processes the data acquired from the digitiser of the apparatus. The resultant joined data is shown above the horizontal axis with peaks shown for the monoisotopic peak (c1), first isotopomer (c2) and second isotopomer (c3). The joined data is the data from the high gain PMT channel (Ch2) except where it becomes saturated, e.g. at peak a1, where it is replaced by the data from the low gain charge pick-up channel (Ch1). Where the low gain data is used it is scaled to fit the level of the high gain channel. Thus, where the output of the high gain channel is saturated (a1), the joined data shows no saturation (c1).

Figure 6:
FIG. 6 shows schematically the embodiment of FIG. 1, 3 or 4 as part of a mass spectrometer.

FIG. 6 shows schematically how an apparatus as shown, for example, in FIG. 1, 3 or 4 may form part of a TOF mass spectrometer. An ion source 20, e.g. a MALDI or ESI source, produces ions which are transmitted through ion optics 22 to focus and/or accelerate the ions and thereby produce a short duration packet of ions of uniform kinetic energy. The packet of ions then travels through a flight region 24, which may comprise one or more ion mirrors to increase flight path length, in order for the packet of ions to become separated in time according to the m/z of the ions. The time separated ions emerge from the flight region 24 to be detected by the detection apparatus 1 as shown in FIG. 1, 3 or 4. It will be appreciated, however, that in principle the type of mass spectrometer and ion source with which the present invention may be used is not limited.

It will be appreciated that many variations can be made to the embodiment shown in FIGS. 1, 3 and 4. Some examples of variations include the following. Different voltages may be applied to the components depending, e.g., on the types and models of components used and the working conditions. Two or more MCPs may be used or a discrete dynode type SEM may be used instead or in addition to the MCP. Different types of metal layer may be employed as well as different scintillators, e.g. organic scintillators. In an alternative arrangement, the fast digitiser 14 may instead be capacitively or inductively coupled to the metal layer 8 so that only transient charges are detected. This is preferable where the metal layer 8 and/or phosphor 4 are not at ground potential. Otherwise, the circuitry following the detection electrode 8 would need to be at the same voltage as that electrode. This may be the case for example for negative ion detection mode wherein the metal layer 8 is typically not at ground potential. An advantageous modification in many instances is the use of a photon guide between the scintillator substrate and the photon detector to efficiently guide the maximum number of photons to the detector. Multiple photon detectors may be employed to maximise the number of photons detected, e.g. two or more PMTs. Alternative types of photon detector may also be employed, e.g. one or more photodiodes or a photodiode array. Some examples of further variations will now be described.

Figure 7A:
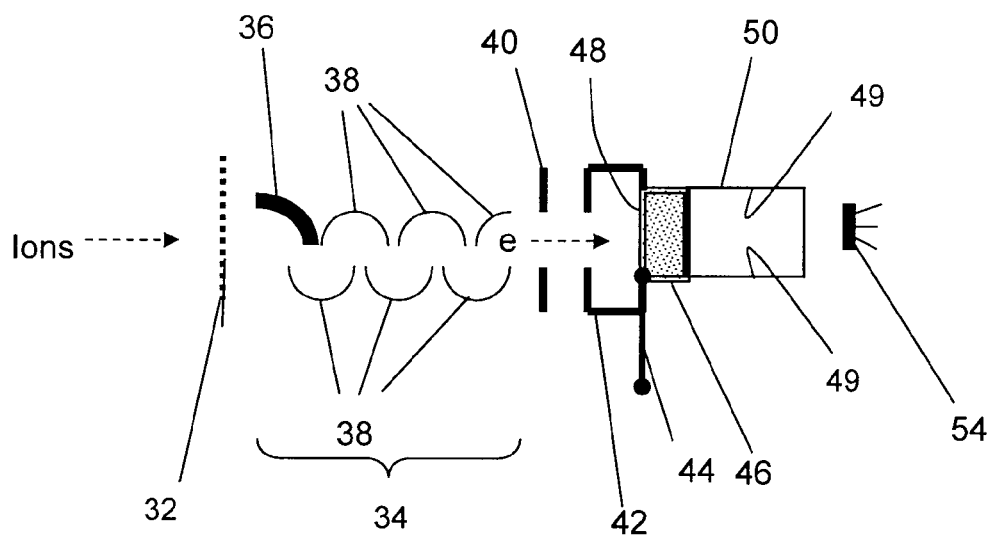
FIGS. 7A and 7B show schematically two other embodiments of apparatus according to the present invention.
Figure 7B:
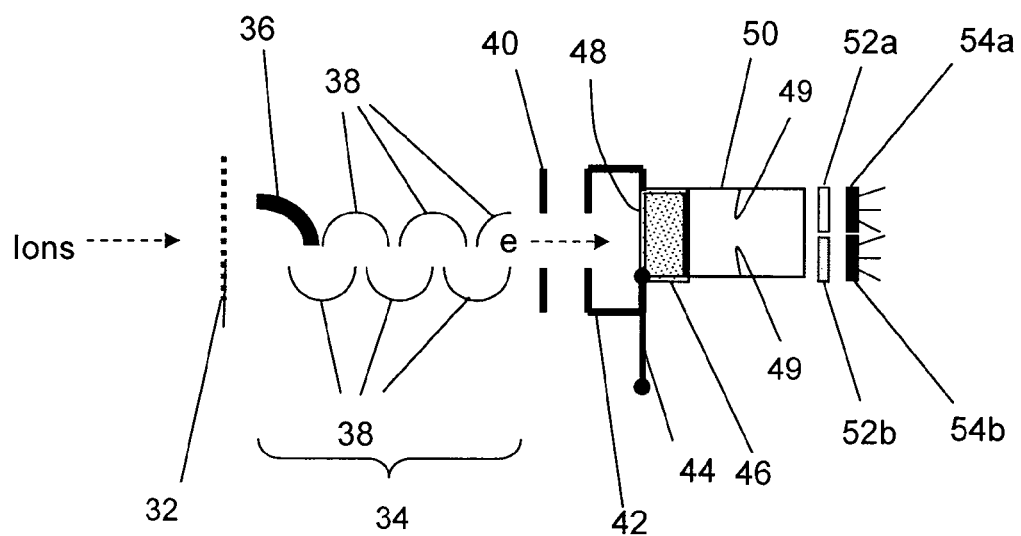

Referring to FIGS. 7A and 7B there is shown schematically two other embodiments according to the present invention. In these embodiments, the incoming ions pass through a grid 32 at ground potential which defines the TOF region and thereafter are incident on a secondary electron multiplier 34 of a discrete dynode type. The ions initially strike conversion dynode 36 held at high voltage (e.g. 10 kV or more). The conversion dynode 36 generates secondary electrons which then proceed through the electron multiplier 34 via a plurality of dynodes 38 each held at progressively more positive voltage than the preceding one to produce a cascade of secondary electrons. The emitted electrons exit from the region of the electron multiplier 34 at position 40 and impinge on a conductive layer (e.g. a thin metal layer) 48 coated on a scintillator material 46. The conductive layer 48 is surrounded by metal shield 42 for shaped like a Faraday cup which also helps shape the electric field to avoid straying of charged particles to undesired surrounding areas. The shielding is, however, optional. Alternatively to using a shield 42, the field may be defined in the region between the electron multiplier 34 and the conductive layer 48 by other means as described below so as to avoid stray particles. The shielding 42 is held at the same potential as the metal layer 48, i.e. ground potential in the case of positively charged incoming ions. The conductive layer 48 is provided thin enough for the energetic secondary electrons from the electron multiplier 34 to penetrate through to the scintillator 46, which comprises a scintillation material dispersed in a solid inert matrix. The thin conductive layer 48 acts as a charge electrode for picking-up the charge changes induced at the layer 48 by the incident secondary electrons and is connected by connection 44 to the input of a fast digitiser (not shown). The scintillator produces photons in response to the incident secondary electrons which thereafter travel through photon guide 50 to the photon detector(s) which are also connected to the input of a fast digitiser (not shown). The photon guide in this case is a glass slab with aluminised internal facing side surfaces 49 (two of which are shown) to reflect the photons toward the detector. In the embodiment shown in FIG. 7A, the photon detector is in the form of a photodiode 54. In the embodiment shown in FIG. 7B, two photon detectors are used in the form of respective identical photodiodes 54a and 54b. Each of the photodiodes 54a and 54b has a different respective photon attenuator 52a and 52b in front of it in order to protect the photodiodes from excessive photon impact and/or ensure that the photodiodes 54a and 54b have different saturation levels. It will be appreciated that the attenuators are optional, or only one photodiode may have an attenuator in front of it for example. The digitiser outputs are treated as described above by means of a connected computer (not shown).

Figure 8:
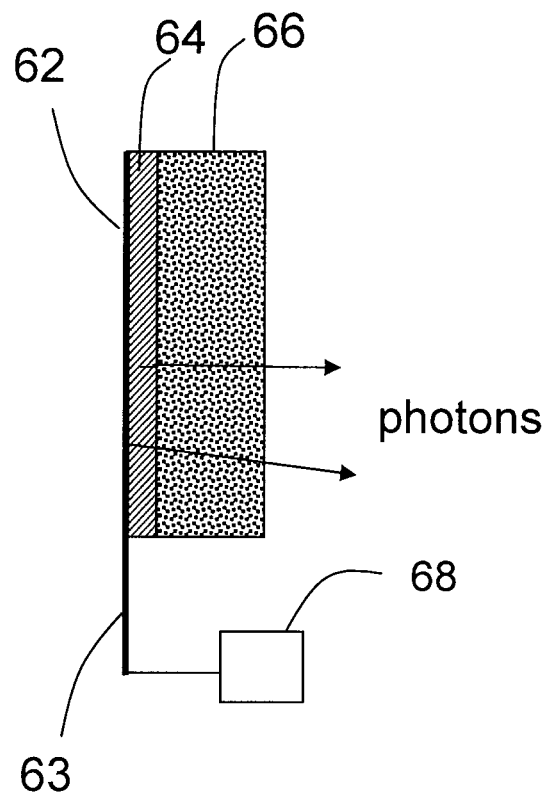
FIG. 8 shows schematically a configuration of scintillator and conductive coating according to the present invention.

Referring to FIG. 8, a more preferred configuration for the scintillator and associated conductive layer coating is shown which may be utilised in any of the embodiments described herein. The configuration comprises a phosphor screen 64 having thereon a thin conductive coating 62 of thickness 50 nm, the phosphor screen 64 being coated on a quartz or glass substrate 66. The conductive coating 62 has a direct connection 63 to a fast digitiser (68).

Figure 9:
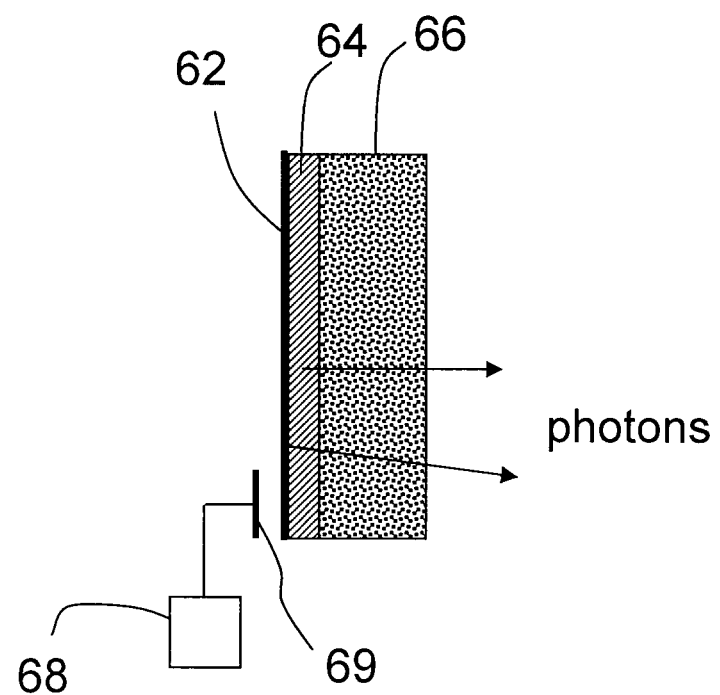
FIG. 9 shows schematically a configuration of scintillator and conductive coating according to the present invention and coupled fast charge meter.

Referring to FIG. 9, there is shown a similar embodiment to that shown in FIG. 8 but instead the fast digitiser 68 is capacitively coupled to the conductive coating 62 via a capacitor plate 69.

Figure 17:
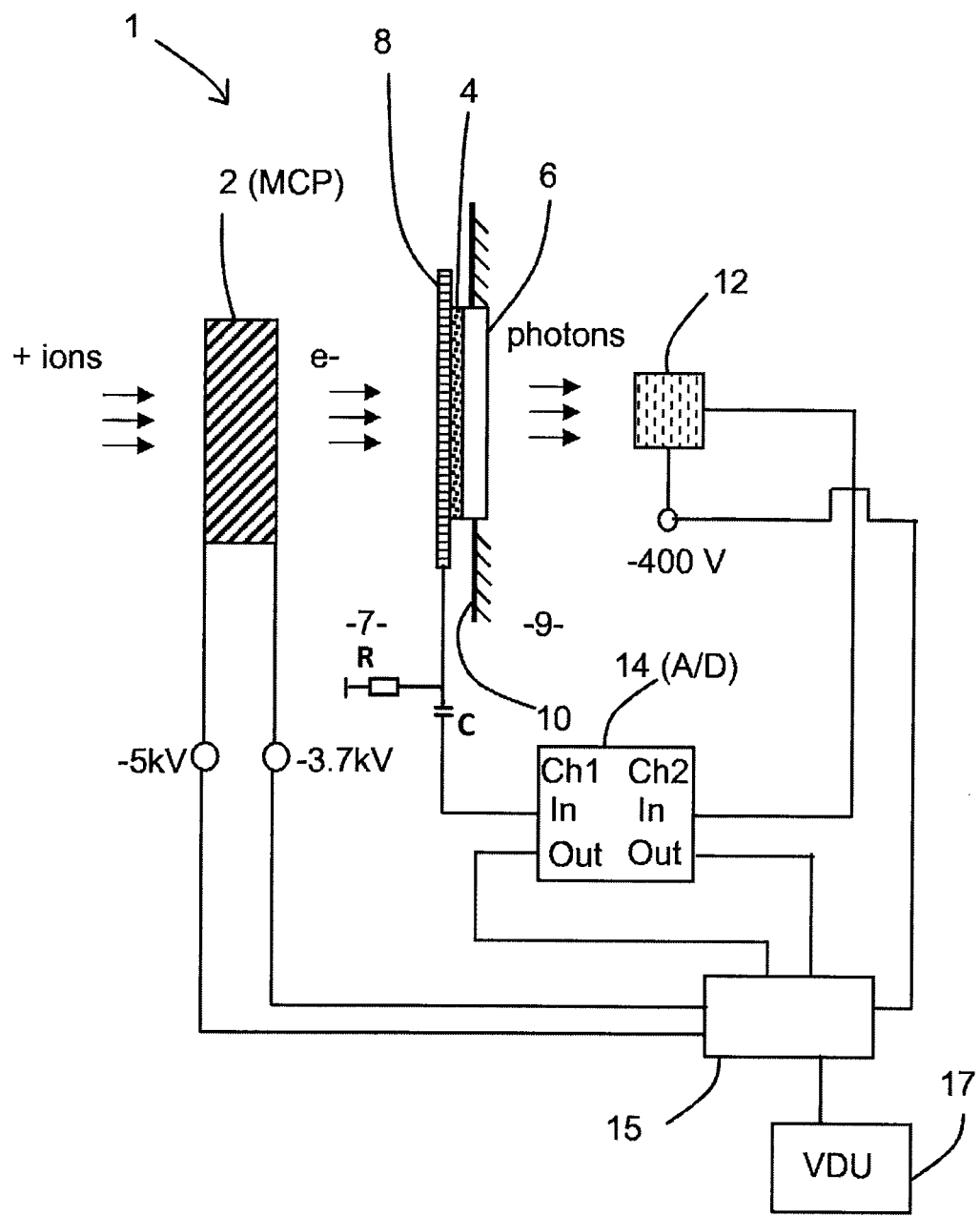
FIG. 17 shows schematically another embodiment of an apparatus for detecting charged particles according to the present invention with capacitive coupling between the charge collector and digitiser.

Referring to FIG. 17, there is shown an apparatus substantially as shown in FIG. 1 but now has capacitive coupling of the charge detector electrode and digitiser, wherein a capacitor C is connected between the charge collector, which is metal layer 8, and the digitiser 14. A resistance R is also positioned on the current path from the metal layer 8.

Figure 18:
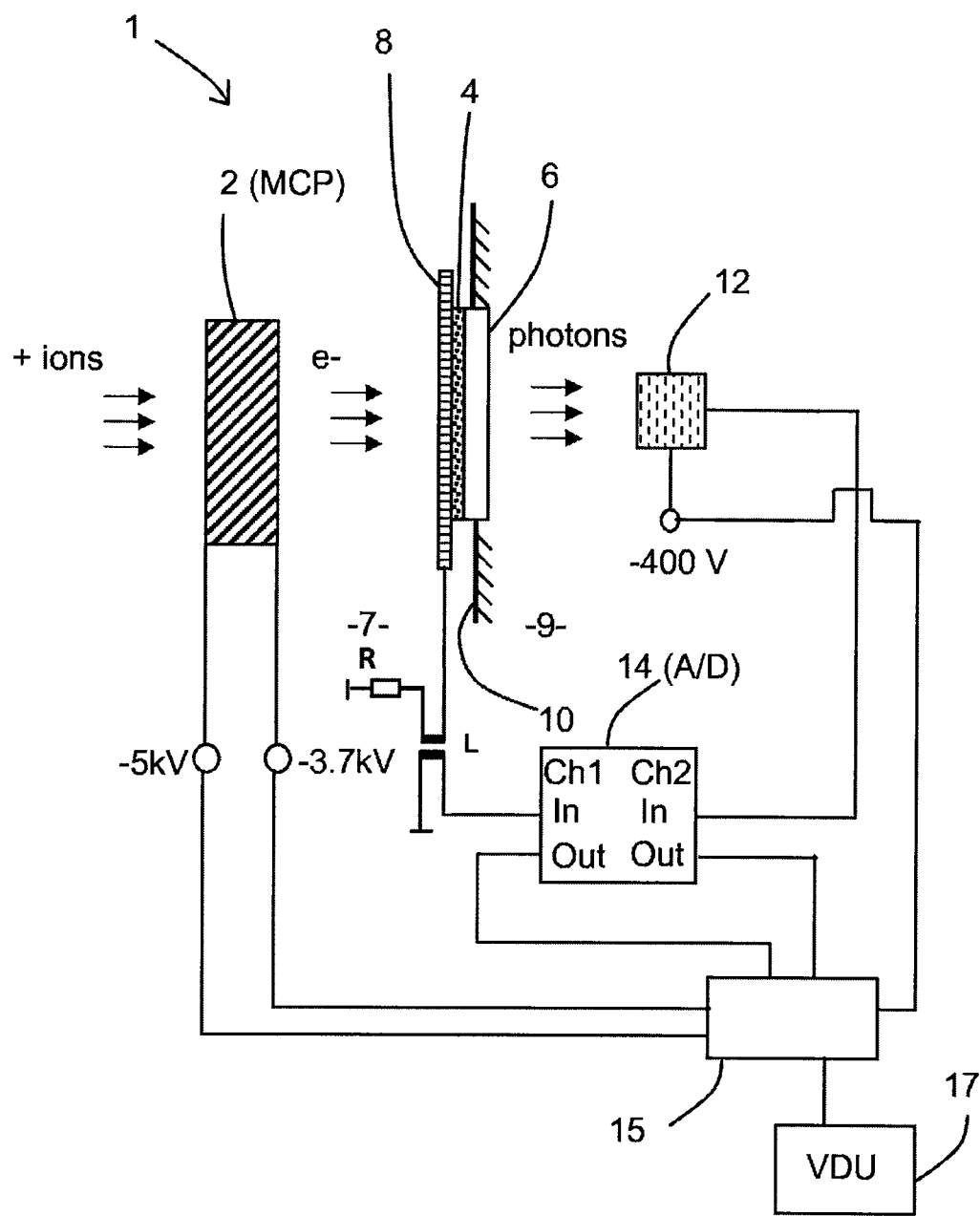
FIG. 18 shows schematically another embodiment of an apparatus for detecting charged particles according to the present invention with inductive coupling between the charge collector and digitiser.

Referring to FIG. 18, there is shown an apparatus substantially as shown in FIG. 1 but now has inductive coupling of the charge detector electrode and digitiser, wherein pair of coils L is connected between the charge collector, which is metal layer 8, and the digitiser 14. A resistance R is also positioned on the current path from the metal layer 8. One end of the secondary coil of the pair L is connected to the digitiser 14 and the other end is grounded. In other embodiments, the other end of the secondary coil, instead of being grounded, could be connected to the digitiser as well giving a differential input. The primary coil of the pair L could be connected to a voltage supply to set the surface of metal layer 8 to a certain voltage. An amplifier (not shown) may be used between the capacitor C or inductor L and the digitiser 14. It will be apparent that in the any of the embodiments of the invention described herein, an amplifier may be used between the charge collection electrode of the charged particle detector and the digitiser.

Figure 10:
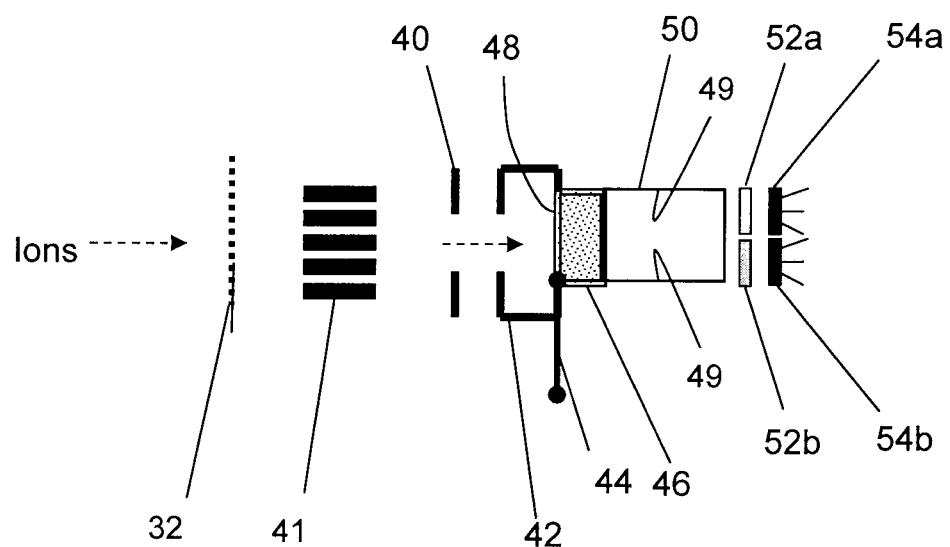
FIG. 10 shows schematically a further embodiment of the present invention with an MCP.

As an alternative to the discrete dynode secondary electron multiplier used in the embodiments shown in FIGS. 7A and 7B, a continuous dynode multiplier may be used. For example, FIG. 10 shows an embodiment similar to those shown in FIGS. 7A and 7B, where like references are used for like components, but an MCP 41 is used to generate the secondary electrons from the incoming ions upstream of the conductive coating electrode 48 and scintillator 46.

Figure 11:
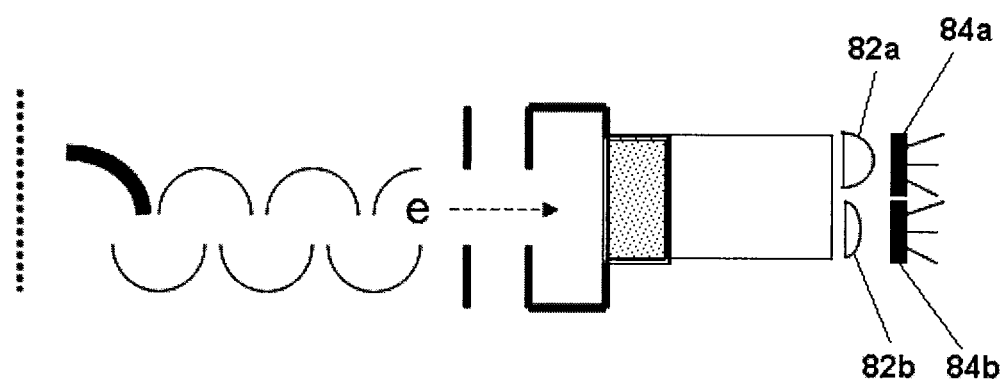
FIG. 11 shows schematically a still further embodiment of the present invention with photon lenses.

As an alternative, or in addition, to the attenuators used in front of the photon detectors as shown in FIG. 7B, there may be used one or more lenses to focus the photons onto a detecting element of the photon detector. The one or more lenses may be spherical or cylindrical lenses. The one or more lenses are preferably Fresnel lenses. In some embodiments, a lens, can be the substrate or part of the substrate of the scintillator. One or more cylindrical lenses, optionally as one or more Fresnel lenses, can be used to better utilise the photon beam and direct it to the photon detectors when more than one photon detector is used. FIG. 11 shows such an embodiment which is generally the same as that shown in FIG. 7B but wherein focusing lenses 82a and 82b are located in front of photon detectors 84a and 84b respectively, which in this embodiment are photodiodes of the avalanche photodiode type. The lenses 82a and 82b may be used as a means to control the dose of photons reaching each detector 84a and 84b. For example, the lenses 82a and 82b in this embodiment have different focusing power as a means of providing differing gain to the detectors 84a and 84b but in other embodiments the lenses may be the same and differing gain, if needed, is provided by other means.

Figure 12:
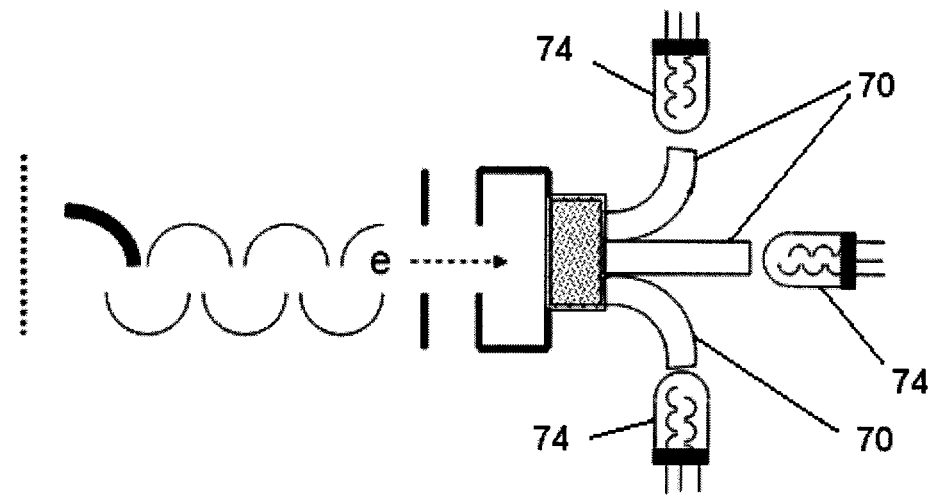
FIGS. 12 and 13 show schematically yet more embodiments of the present invention with splitting waveguides.
Figure 13:
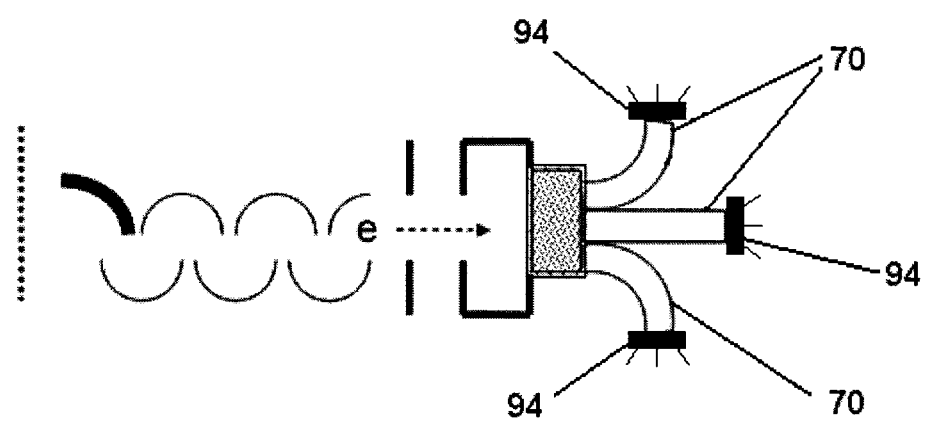

Referring to FIG. 12, there is shown another embodiment, similar to those of FIGS. 7A and 7B except that, as a photon guide, there is a plurality of splitting waveguides 70, each waveguide transmitting the photons to respective detectors in the form of photomultiplier tubes (PMTs) 74. The splitting waveguides 70 may each comprise, for example, a fibre optic cable or bundle of fibre optic cables. In place of the PMTs 74 shown in FIG. 12, photodiodes 94 may used as shown in FIG. 13, which is otherwise the same embodiment as shown in FIG. 12.

Examples of preferred combinations of components include those in the following table:

| Embodiment example no. | Secondary electron generator | Charge detection | Scintillator | Photon detection |
|---|---|---|---|---|
| 1 | MCP | Metal coating on scintillator with capacitively or inductively coupled digitiser | Phosphor screen | One or more PMTs |

-continued

| Embodiment example no. | Secondary electron generator | Charge detection | Scintillator | Photon detection |
|---|---|---|---|---|
| 2 | Discrete dynode SEM | Metal coating on scintillator with capacitively or inductively coupled digitiser | Phosphor screen | One or more PMTs |
| 3 | MCP | Metal coating on scintillator with directly coupled digitiser | Phosphor screen | One or more PMTs |
| 4 | Discrete dynode SEM | Metal coating on scintillator with directly coupled digitiser | Phosphor screen | One or more PMTs |
| 5 | MCP | Metal coating on scintillator with capacitively or inductively coupled digitiser | Phosphor screen | One or more avalanche photodiodes |
| 6 | Discrete dynode SEM | Metal coating on scintillator with capacitively or inductively coupled digitiser | Phosphor screen | One or more avalanche photodiodes |
| 7 | MCP | Metal coating on scintillator with directly coupled digitiser | Phosphor screen | One or more avalanche photodiodes |
| 8 | Discrete dynode SEM | Metal coating on scintillator with directly coupled digitiser | Phosphor screen | One or more avalanche photodiodes |

Figure 14:
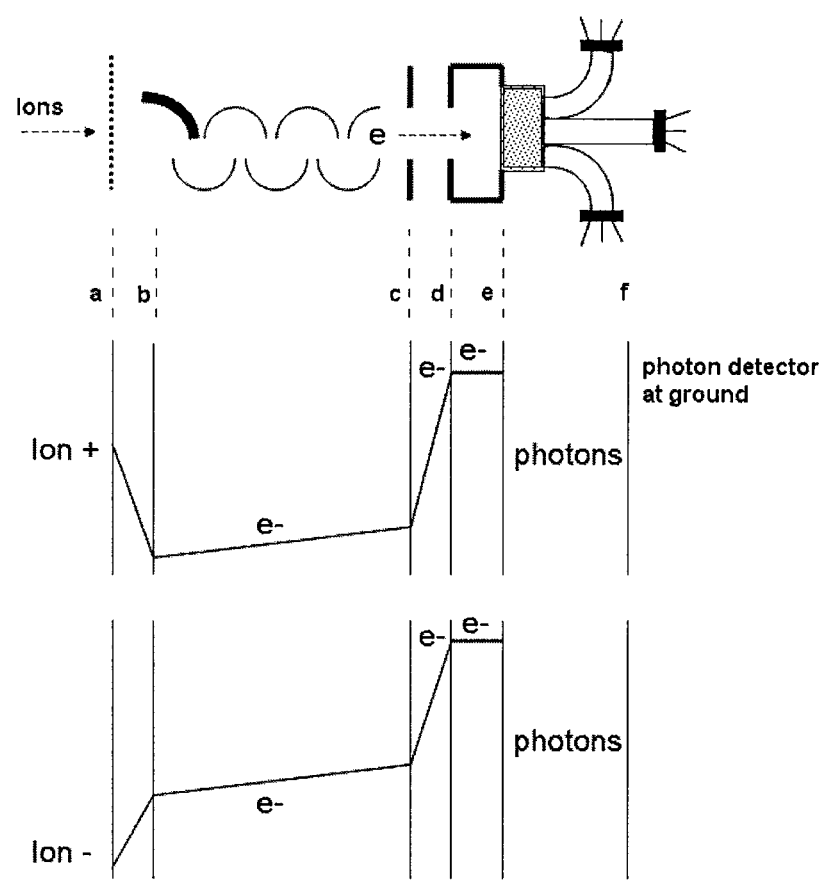
FIG. 14 shows schematically the electric fields across the various stages of the apparatus according to the invention.

Referring to FIG. 14 there is shown schematically the electric fields across the various stages of the apparatus according to the invention. The embodiment shown in FIG. 13 is used as a reference and is shown in the top of FIG. 14 and the various positions a, b, c, d, e and f along the longitudinal coordinate (i.e. running from the front of the apparatus to the rear, or left to right in the Figure) are indicated. Two traces for the electric field are shown in FIG. 14: the top trace is the electric field employed for detecting positively charged incoming ions and the bottom trace is the electric field employed for detecting negatively charged incoming ions. It should be noted that in FIG. 14 there is no absolute scale shown and only the relative voltages are shown within each trace. Moreover, the top and bottom traces are on different scales to each other. Position a represents the incoming ions in the vacuum of the mass spectrometer before entering the detection apparatus of the present invention. At position b, which represents, e.g., a conversion dynode of an SEM or front end of an MCP, a high voltage is applied to accelerate the incoming ions, which is a large negative voltage in the case of positively charged incoming ions and is a large positive voltage in the case of negatively charged incoming ions. Position c represents the last stage of the, e.g., SEM or rear of an MCP. Between positions b and c, there is a field gradient towards positive to transmit the secondary electrons through the SEM or MCP. Position d represents the potential of shielding around the conductive layer charge pick-up and position e represents the potential of the conductive layer. It is noted that, as described above, the shielding is optional and in other embodiments without such shielding, the positions d and e can be represented as one position (i.e. the potential at the conductive layer). Both positions d and e are conveniently held at ground potential when the incoming ions are positively charged (top trace in FIG. 14) so that the secondary electrons are accelerated away from the SEM or MCP toward the conductive layer and the scintillator behind it. However, when the incoming ions are negatively charged (bottom trace in FIG. 14) the shield and conductive layer at positions d and e are necessarily at high positive voltage. The photons generated from the scintillator are unaffected by electric fields and travel through an electric field free region to be detected at position f at ground potential. The photon generation and detection thus provides high voltage decoupling from the electron multiplier/detector in cases where it is needed.

Figure 15A:
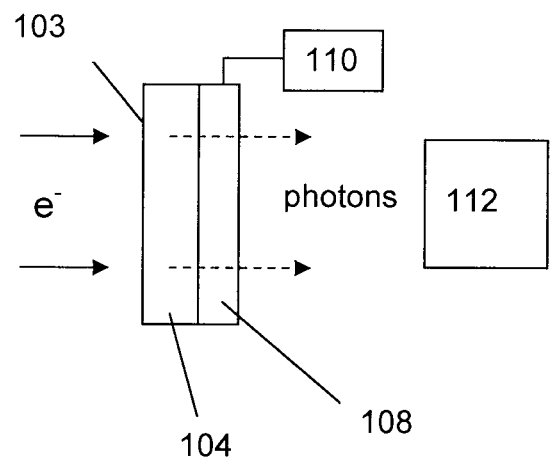
FIGS. 15A and 15B show schematically further configurations of scintillator and conductive layer for use in the present invention.
Figure 15B:
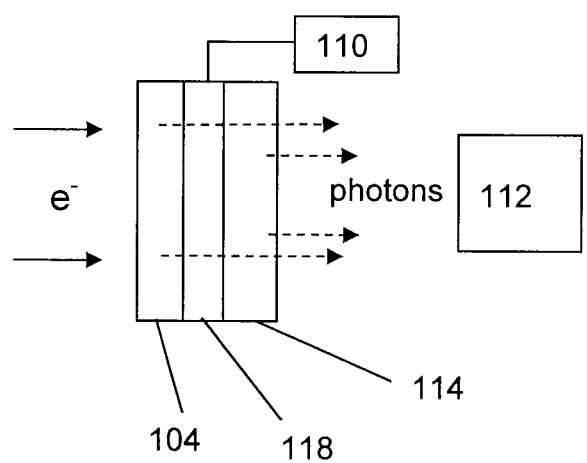

Referring to FIGS. 15A and 15B there are shown schematically further configurations of scintillator and conductive layer for use in the present invention. In FIG. 15A, there is shown a configuration for the scintillator and associated conductive layer which may be utilised in embodiments of the present invention. The configuration comprises a scintillator 104 having an impact side 103 which is impacted in use by incoming ions or secondary electrons (e⁻) generated from the ions. Photons are generated in the scintillator 104 which travel in all directions including onwards (shown by dotted arrows) through a conductive layer 108 which is transparent to photons to a photon detector 112. The scintillator is at least partially transparent to charged particles such as electrons so that at least some ions or electrons pass through the scintillator 104 (i.e. which have not been consumed in photon generating events in the scintillator 104). The conductive layer 108 is connected to a digitiser 110 and the charge induced by the arrival of ions or electrons at the conductive layer 108 through the scintillator 104 is detected as described herein. In FIG. 15B, there is shown a modification of the embodiment shown in FIG. 15A in which a conductive layer is shown sandwiched between two scintillators. In addition to the components shown in FIG. 15A, in FIG. 15B there is also shown a conductive layer 118 in place of conductive layer 108, the conductive layer 118 being transparent to both electrons and photons. Accordingly, electrons may pass through conductive layer 118 to reach a second scintillator 114, the passage of charge being picked-up by digitiser 110 as before. Photons are then also generated in the second scintillator 114. Photons from the two scintillators are detected at the detector 114.

Figure 16:
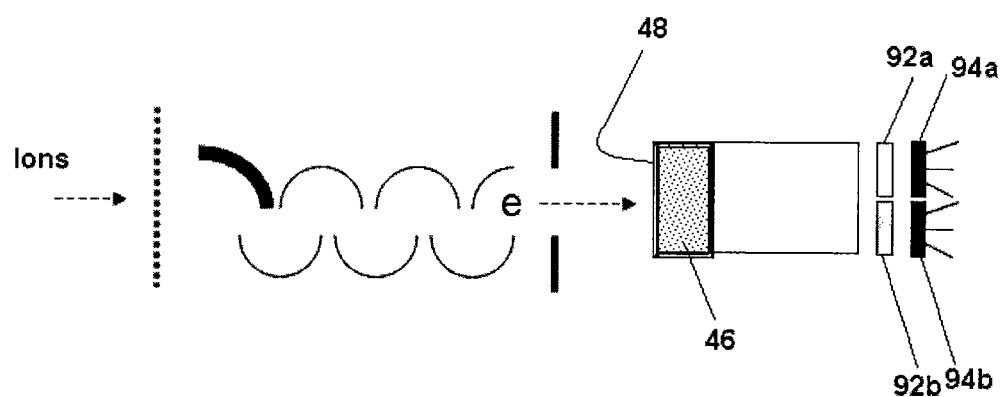
FIG. 16 shows schematically an apparatus according to a different aspect of the present invention wherein there is no charged particle detector for detecting secondary electrons.

The present invention in a different aspect also provides an apparatus and method wherein there is no charged particle detector and instead the apparatus and method comprises two or more photon detectors. FIG. 16 shows schematically such an apparatus wherein there is no charge meter in the apparatus, e.g. no digitiser coupled to the conductive coating on the scintillator. Instead, two photodiodes 94a and 94b are used in this example, which are arranged to provide different gain photon detection by means of different strength photon attenuators 92a and 92b positioned in front of the photodiodes 94a and 94b respectively. Various alternative means of providing differing gain than the use of attenuators may be used as described herein. The two or more photon detectors may be the same or different. As alternatives to the example shown in FIG. 16, it will be appreciated that instead of two photodiodes there may be used two or more PMTs, or there may be used a photodiode and PMT, thereby achieving different gain through the use of two different types of photon detector. Many other different configurations and/or combinations of photon detectors may be envisaged for used this different aspect of the present invention.

The use of two (or more) photon detectors, of different gain, for example can be useful when the instrument is required to operate with both positive and negative incoming ions, as the photons provide a high voltage decoupling between the conductive layer and phosphor and the photon detector. With such an arrangement, different detection configurations may be envisaged. For example, whilst a capacitively or inductively coupled digitiser for charge detection may be used and may be preferable in many cases for the negative ion detection mode, in other cases of negative ion detection a capacitively or inductively coupled digitiser for charge detection may not be required and instead the use of two (or more) photon detectors, of different gain, may be used when in the negative ion detection mode. In some embodiments, a directly coupled digitiser for charge detection may be used in the positive ion detection mode with switching to the use of two (or more) photon detectors, of different gain, when in the negative ion detection mode.

As used herein, including in the claims, unless the context indicates otherwise, singular forms of the terms herein are to be construed as including the plural form and vice versa. For instance, unless the context indicates otherwise, a singular reference herein including in the claims, such as "a" or "an" (e.g. an electron multiplier, a photon detector etc.) means "one or more" (e.g. one or more electron multipliers, one or more photon detectors etc.).

Throughout the description and claims of this specification, the words "comprise", "including", "having" and "contain" and variations of the words, for example "comprising" and "comprises" etc, mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

The use of any and all examples, or exemplary language ("for instance", "such as", "for example" and like language) provided herein, is intended merely to better illustrate the invention and does not indicate a limitation on the scope of the invention unless otherwise claimed. No language in the specification should be construed as indicating any non-claimed element as essential to the practice of the invention.

Any steps described in this specification may be performed in any order or simultaneously unless stated or the context requires otherwise.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

The invention claimed is:

1. A detection apparatus for detecting charged particles comprising:
   a charged particle detector for receiving and detecting either incoming charged particles or secondary charged particles generated from the incoming charged particles;
   a photon generator for generating photons in response to receiving at least some of the same incoming charged particles or secondary charged particles generated from the incoming charged particles as are received and detected by the charged particle detector; and
   a photon detector for detecting photons generated by the photon generator,
   wherein the charged particle detector comprises an electrode for receiving and detecting either incoming charged particles or secondary charged particles generated from the incoming charged particles and the electrode is transparent to charged particles.

2. A detection apparatus as claimed in claim 1 wherein the photon generator is for generating photons in response to receiving at least some of the same incoming charged particles or secondary charged particles generated from the incoming charged particles as are received and detected by the charged particle detector which have passed through the transparent electrode.

3. A detection apparatus as claimed in claim 1 wherein the photon generator is for generating photons in response to receiving more than 50% of the same incoming charged particles or secondary charged particles generated from the incoming charged particles as are received and detected by the charged particle detector.

4. A detection apparatus as claimed in claim 3 wherein the photon generator is for generating photons in response to receiving more than 75% of the same incoming charged particles or secondary charged particles generated from the incoming charged particles as are received and detected by the charged particle detector.

5. A detection apparatus as claimed in claim 1 wherein the photon generator is for generating photons in response to receiving more than 90% of the same incoming charged particles or secondary charged particles generated from the incoming charged particles as are received and detected by the charged particle detector.

6. A detection apparatus as claimed in claim 1 wherein the electrode comprises a conductive material associated with the photon generator.

7. A detection apparatus as claimed in claim 6 wherein the conductive material comprises a conductive layer in contact with the photon generator.

8. A detection apparatus as claimed in claim 7 wherein the conductive layer comprises a metal layer.

9. A detection apparatus as claimed in claim 1 wherein the electrode is coupled to a digitiser or digital oscilloscope.

10. A detection apparatus as claimed in claim 9 wherein the electrode is capacitively coupled to the digitiser or digital oscilloscope.

11. A detection apparatus as claimed in claim 1 further comprising a secondary particle generator for generating secondary charged particles in response to receiving incoming charged particles;
   wherein the charged particle detector is for receiving and detecting secondary charged particles generated by the secondary particle generator and the photon generator is for generating photons in response to receiving secondary charged particles generated by the secondary particle generator.

12. A detection apparatus as claimed in claim 11 wherein the secondary particle generator is a secondary electron generator which comprises a conversion dynode, a discrete dynode SEM and/or a continuous dynode SEM; and wherein the photon generator comprises a scintillator; and the photon detector comprises a solid state photon detector.

13. A detection apparatus as claimed in claim 1 further comprising ion optics for focusing the incoming charged particles or secondary charged particles generated from the incoming charged particles and thereby varying the current of the incoming charged particles or secondary charged particles generated from the incoming charged particles which impinge on the charged particle detector and/or the photon generator.

14. A detection apparatus as claimed in claim 1 wherein the charged particle detector and the photon detector each comprise an output which is connected to a digitiser to generate digital data from each detector and the digitiser is connected to a computer for processing the data by joining the data generated from the charged particle detector and the data generated from photon detector so as to produce a joined data set.

15. A detection apparatus as claimed in claim 1 comprising two or more secondary particle generators and/or two or more charged particle detectors and/or two or more photon generators and/or two or more photon detectors.

16. A method of improving the dynamic range of detection for a TOF mass spectrometer comprising:
    receiving incoming charged particles at a detection apparatus, the detection apparatus comprising:
        at least two detectors of different gain, including:
        a charged particle detector for receiving and detecting either incoming charged particles or secondary charged particles generated from the incoming charged particles;
        a photon generator for generating photons in response to receiving at least some of the same incoming charged particles or secondary charged particles generated from the incoming charged particles as are received and detected by the charged particle detector; and
        a photon detector for detecting photons generated by the photon generator; and
    detecting the incoming charged particles via the at least two detectors.

* * * * *